(12) United States Patent
Jang

(10) Patent No.: US 11,929,017 B2
(45) Date of Patent: Mar. 12, 2024

(54) APPARATUS AND METHOD FOR MANUFACTURING DISPLAY DEVICE

(71) Applicant: Samsung Display Co., LTD., Yongin-si (KR)

(72) Inventor: Joo Nyung Jang, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/096,099

(22) Filed: Jan. 12, 2023

(65) Prior Publication Data
US 2023/0316990 A1 Oct. 5, 2023

(30) Foreign Application Priority Data
Mar. 31, 2022 (KR) .......................... 10-2022-0040264

(51) Int. Cl.
| | |
|---|---|
| *G09G 3/32* | (2016.01) |
| *H01L 25/16* | (2023.01) |
| *H01L 27/12* | (2006.01) |
| *H03K 5/01* | (2006.01) |

(52) U.S. Cl.
CPC .............. *G09G 3/32* (2013.01); *H01L 25/167* (2013.01); *H01L 27/124* (2013.01); *H03K 5/01* (2013.01); *G09G 2300/0426* (2013.01); *G09G 2300/0861* (2013.01); *G09G 2310/0291* (2013.01); *G09G 2310/06* (2013.01); *G09G 2310/08* (2013.01); *G09G 2330/028* (2013.01)

(58) Field of Classification Search
CPC ............. G09G 3/32; G09G 2300/0426; G09G 2300/0861; G09G 2310/0291; G09G 2310/06; G09G 2310/08; G09G 2330/028; H01L 25/167; H01L 27/124; H01L 25/0753; H01L 33/0095; H03K 5/01
See application file for complete search history.

(56) References Cited

U.S. PATENT DOCUMENTS

| | | | |
|---|---|---|---|
| 2012/0013594 A1* | 1/2012 | Ishihara | ............... G09G 3/3659 345/87 |
| 2021/0320089 A1* | 10/2021 | Kang | ..................... H05K 13/04 |
| 2021/0359165 A1* | 11/2021 | Im | ............................ H01L 33/62 |
| 2022/0005979 A1* | 1/2022 | Kang | ................... H01L 25/0753 |
| 2022/0190025 A1* | 6/2022 | Yoo | ......................... H01L 33/20 |

FOREIGN PATENT DOCUMENTS

KR 10-1436123 11/2014

* cited by examiner

*Primary Examiner* — Andrew Sasinowski
(74) *Attorney, Agent, or Firm* — KILE PARK REED & HOUTTEMAN PLLC

(57) ABSTRACT

An apparatus for manufacturing a display device comprises a stage, a panel cell disposed on the stage and including a first alignment line, and a second alignment line extending parallel to the first alignment line, a field application part providing an alignment signal to the first alignment line and the second alignment line of the panel cell, and light-emitting elements aligned between the first alignment line and the second alignment line. The field application part provides an alignment signal to the first alignment line and the second alignment line, the alignment signal having the same positive integral value and negative integral value, having a different positive peak voltage from the alignment signal's negative peak voltage, and having a different positive pulse width from the alignment signal's negative pulse width.

20 Claims, 18 Drawing Sheets

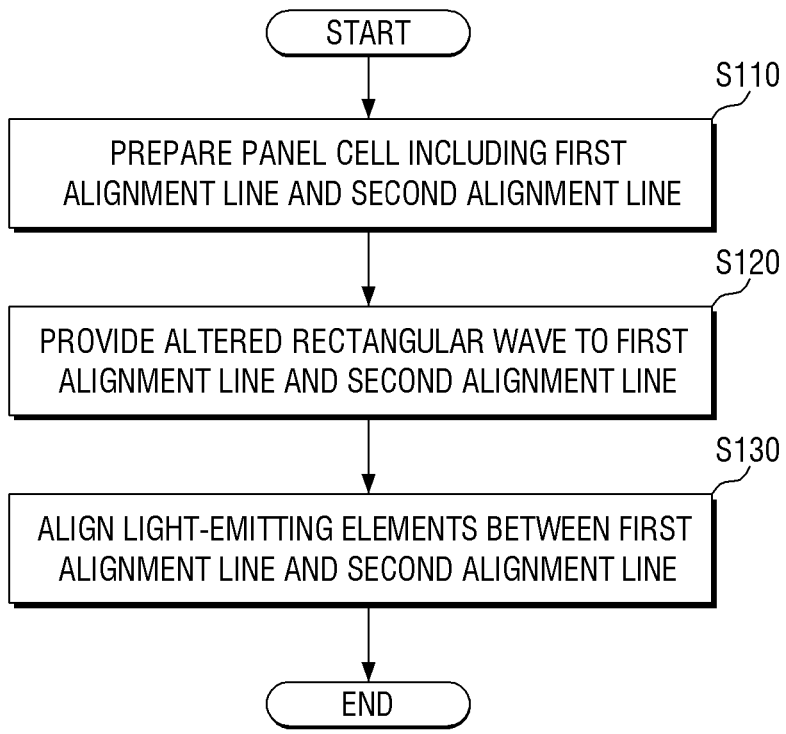

APPARATUS AND METHOD FOR MANUFACTURING DISPLAY DEVICE

CROSS-REFERENCE TO RELATED APPLICATION(S)

This application claims priority to and benefits of Korean Patent Application No. 10-2022-0040264 under 35 U.S.C. § 119, filed on Mar. 31, 2022 in the Korean Intellectual Property Office, the entire contents of which are herein incorporated by reference.

BACKGROUND

1. Technical Field

The disclosure relates to an apparatus and method for manufacturing a display device.

2. Description of the Related Art

Display devices are becoming more important with developments in multimedia technology. Accordingly, various display devices such as an organic light-emitting diode (OLED) display device, a liquid crystal display (LCD) device, and the like have been used.

Typically, a display device includes a display panel for displaying an image, such as a light-emitting display panel or an LCD panel. The light-emitting display panel can display an image by emitting light with the use of light-emitting elements. Particularly, light-emitting diodes (LEDs) such as OLEDs, which use an organic material as a fluorescent material, and inorganic LEDs, which use an inorganic material as a fluorescent material, can be used as the light-emitting elements. An apparatus for manufacturing a display device may align inorganic LEDs on a display device by using alignment signals.

SUMMARY

Aspects of the disclosure provide an apparatus and method for manufacturing a display device, which can improve the emission efficiency of a display device by improving the efficiencies of alignment and deflection of light-emitting elements.

However, aspects of the disclosure are not restricted to those set forth herein. The above and other aspects of the disclosure will become more apparent to one of ordinary skill in the art to which the disclosure pertains by referencing the detailed description of the disclosure given below.

According to an embodiment of the disclosure, an apparatus for manufacturing a display device may include a stage, a panel cell disposed on the stage and including a first alignment line, and a second alignment line extending parallel to the first alignment line, a field application part providing an alignment signal to the first alignment line and the second alignment line of the panel cell, and light-emitting elements aligned between the first alignment line and the second alignment line. The field application part may provide an alignment signal to the first alignment line and the second alignment line, the alignment signal having the same positive integral value and negative integral value, having a different positive peak voltage from the alignment signal's negative peak voltage, and having a different positive pulse width from the alignment signal's negative pulse width.

The alignment signal may correspond to a difference in electric potential between first and second alignment signals, which may be applied to the first alignment line and the second alignment line.

In case that the positive pulse width of the alignment signal is less than the negative pulse width of the alignment signal, the positive peak voltage of the alignment signal may be higher than the negative peak voltage of the alignment signal.

In case that the alignment signal is a rectangular wave having a cycle of T, a positive pulse width of A, and a positive peak voltage of B (where T, A, B may be positive real numbers), the negative pulse width of the alignment signal may be T−A, and the negative peak voltage of the alignment signal may be $-(A \times B)/(T-A)$.

In case that a threshold voltage of the alignment signal is zero, a net direct current (DC) voltage of the alignment signal may be zero.

In case that a threshold voltage of the alignment signal exceeds the negative peak voltage of the alignment signal, a net DC voltage of the alignment signal may be maximized.

As an RC value of the panel cell increases, a net DC voltage of the alignment signal may decrease.

The apparatus may further include a voltage output generating and outputting the alignment signal, an amplifier amplifying the alignment signal and providing the amplified alignment signal to the field application part, a controller providing a control signal, which determines a waveform of the alignment signal, to the voltage output, an emission driver receiving an emission timing signal from the controller and outputting an emission driving signal, and a light irradiation part receiving the emission driving signal from the emission driver and applying light to the panel cell.

The controller may synchronize the control signal and the emission timing signal such that the alignment signal and the emission timing signal may have a same frequency.

According to an embodiment of the disclosure, an apparatus for manufacturing a display device may include a stage, a panel cell disposed on the stage and including a first alignment line and a second alignment line extending parallel to the first alignment line, a field application part providing an alignment signal to the first alignment line and the second alignment line of the panel cell, and light-emitting elements aligned between the first alignment line and the second alignment line. The field application part may provide an alignment signal to the first alignment line and the second alignment line, the alignment signal having a different positive peak voltage from the alignment signal's negative peak voltage, having a different positive pulse width from the alignment signal's negative pulse width, and having an initial direct current (DC) component of 0

In case that the positive pulse width of the alignment signal is less than the negative pulse width of the alignment signal, the positive peak voltage of the alignment signal may be higher than the negative peak voltage of the alignment signal.

In case that the alignment signal is a rectangular wave having a cycle of T, a positive pulse width of A, and a positive peak voltage of B (where T, A, B may be positive real numbers), the negative pulse width of the alignment signal may be T−A, and the negative peak voltage of the alignment signal may be $-(A \times B)/(T-A)$.

In case that a threshold voltage of the alignment signal is zero, a net DC voltage of the alignment signal may be zero.

In case that a threshold voltage of the alignment signal exceeds the negative peak voltage of the alignment signal, a net DC voltage of the alignment signal may be maximized.

As an RC value of the panel cell increases, the net DC voltage of the alignment signal may decrease.

According to an embodiment of the disclosure, a method of manufacturing a display device may include preparing a panel cell including a first alignment line, and a second alignment line extending parallel to the first alignment line, providing an alignment signal to the first alignment line and the second alignment line, the alignment signal having a same positive integral value and negative integral value, having a different positive peak voltage from the alignment signal's negative peak voltage, and having a different positive pulse width from the alignment signal's negative pulse width, and aligning light-emitting elements between the first alignment line and the second alignment line.

In case that the positive pulse width of the alignment signal is less than the negative pulse width of the alignment signal, the positive peak voltage of the alignment signal may be higher than the negative peak voltage of the alignment signal.

In case that the alignment signal is a rectangular wave having a cycle of T, a positive pulse width of A, and a positive peak voltage of B (where T, A, B may be positive real numbers), the negative pulse width of the alignment signal may be T−A, and the negative peak voltage of the alignment signal may be −(A×B)/(T−A).

In case that a threshold voltage of the alignment signal is zero, a net direct current (DC) voltage of the alignment signal may be zero.

In case that a threshold voltage of the alignment signal exceeds the negative peak voltage of the alignment signal, a net DC voltage of the alignment signal may be maximized.

According to the aforementioned and other embodiments of the disclosure, the efficiencies of alignment and deflection of light-emitting elements can be improved by providing an alignment signal having the same positive and negative integral values, having a different positive peak voltage from its negative peak voltage, and having a different positive pulse width from its negative pulse width. Accordingly, the emission efficiency of a display device can be improved.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which:

FIG. 27 is a schematic flowchart illustrating a method of manufacturing a display device according to an embodiment of the disclosure.

DETAILED DESCRIPTION OF THE EMBODIMENTS

Figure 1:
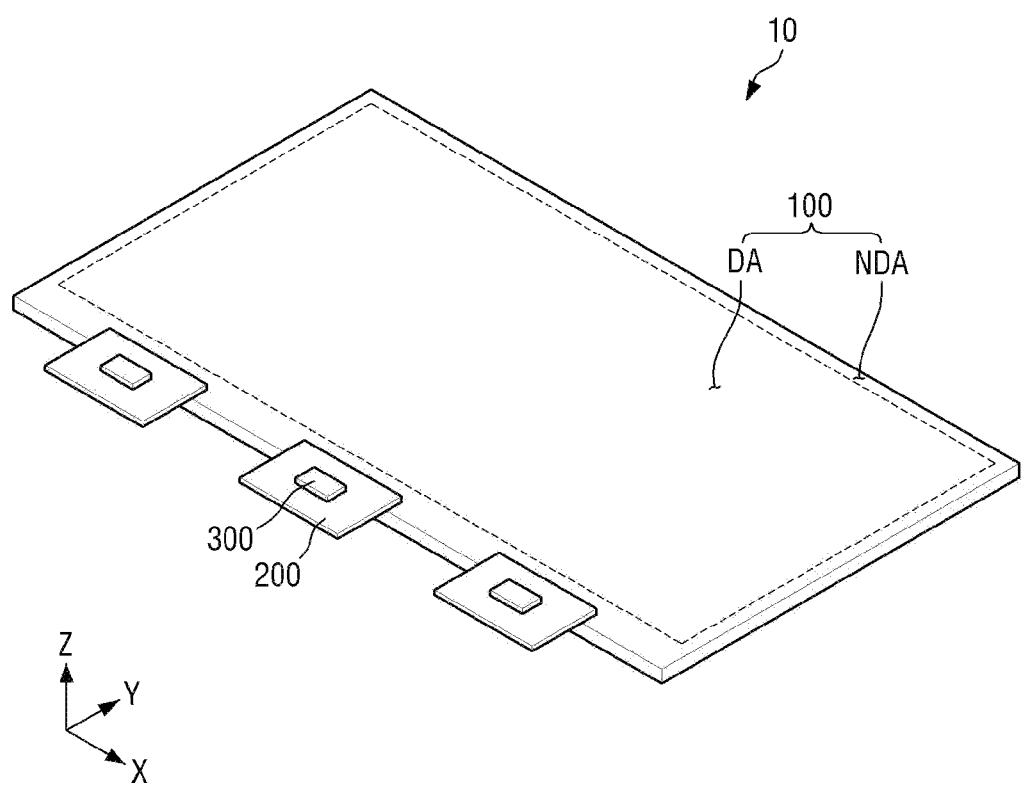
FIG. 1 is a schematic perspective view of a display device according to an embodiment of the disclosure.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more aspects of the disclosure disclosed herein. It is apparent, however, that various embodiments may be practiced without these specific details or with one or more equivalent arrangements. In other instances, structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. In case that an embodiment may be implemented differently, a specific process order may be performed differently from the described order. For example, two consecutively described processes may be performed substantially at the same time or performed in an order opposite to the described order. Like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there may be no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that may not be perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. For example, "A and/or B" may be understood to mean any combination including "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art. As but one set of examples, "about" may mean within one or more standard deviations, or within ±30%, 20%, 10%, 5% of the stated value.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Hereinafter, detailed embodiments of the disclosure will be described with reference to the accompanying drawings.

FIG. 1 is a schematic perspective view of a display device according to an embodiment of the disclosure.

Referring to FIG. 1, a display device 10 may display a moving image or a still image. For example, the display device 10 can be applied to a portable electronic device such as a mobile phone, a smartphone, a tablet personal computer (PC), a mobile communication terminal, an electronic notepad, an electronic book (e-book), a portable multimedia player (PMP), a navigation device, or an ultra-mobile PC (UMPC). In another example, the display device 10 can be applied as the display unit of a television (TV), a notebook computer, a monitor, a billboard, or an Internet-of-Things (IoT) device. In another example, the display device 10 can be applied to a wearable device such as a smartwatch, a watchphone, a glasses display, or a head-mounted display (HMD). In another example, the display device 10 can be applied to the dashboard, the center fascia, or the center information display (CID) of a vehicle, the room mirror display of a vehicle that can replace side-view mirrors, or an entertainment display disposed at the rear of the front seat of a vehicle.

The display device 10 may have an almost rectangular shape in a plan view. For example, the display device 10 may have an almost rectangular shape with long sides in the first direction (or the X-axis direction) and short sides in the second direction (or the Y-axis direction) in a plan view. The corners at which the short sides and the long sides of the display device 10 meet may be rounded or right-angled. The planar shape of the display device 10 is not limited to a rectangular shape, and the display device 10 may be formed in various other shapes, such as another polygonal shape, a circular shape, or an elliptical shape.

The display device 10 may include a display panel 100, circuit boards 200, and display drivers 300. The display panel 100 may include a display area DA and a non-display area NDA.

The display area DA may include pixels, which display an image. The display area DA may emit light through multiple emission or opening areas. The display panel 100 may include pixel circuitry including switching elements, a pixel-defining film defining the emission or opening areas, and self-light-emitting elements. For example, the self-light-emitting elements may include organic light-emitting diodes (OLEDs) including organic light-emitting layers, quantum-dot light-emitting diodes (LEDs) including quantum-dot light-emitting layers, inorganic LEDs including an inorganic semiconductor, and/or microLEDs, but the disclosure is not limited thereto.

The non-display area NDA may be disposed around the display area DA. The non-display area NDA may be defined as an edge area of the display panel 100. The non-display area NDA may include gate drivers, which provide gate signals to gate lines, fan-out lines, which electrically connect the display drivers 300 and the display area DA, and pad units, which are connected to the circuit boards 200.

The circuit boards 200 may be attached to the pad units of the display panel 100 via anisotropic conductive films (ACFs). Lead lines of the circuit boards 200 may be electrically connected to the pad units of the display panel 100. The circuit boards 200 may be flexible films such as printed circuit boards (PCBs), flexible PCBs (FPCBs), or chip-on-films (COFs).

The display drivers 300 may output signals and voltages for driving the display panel 100. The display driver 300 may provide data voltages to data lines. The display drivers 300 may provide power supply voltages to power lines and may provide gate control signals to the gate drivers. The display drivers 300 may be formed as integrated circuits (Ics) and may be mounted on the circuit boards 200. In other embodiments, the display drivers 300 may be mounted on the display panel 100 in a chip-on-glass (COG) manner or a chip-on-plastic (COP) manner or via ultrasonic bonding.

Figure 2:
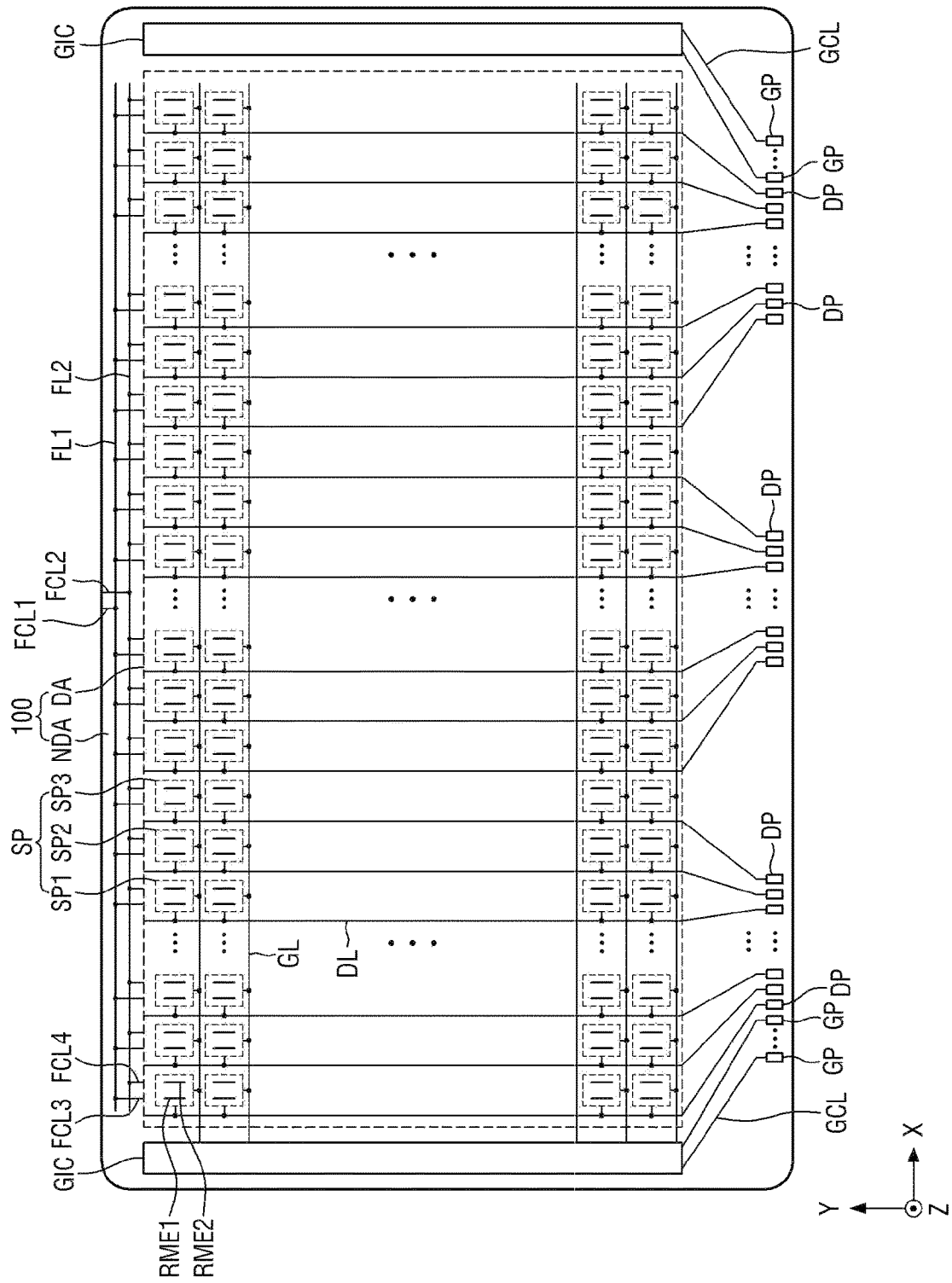
FIG. 2 is a schematic plan view of the display device of FIG. 1.

FIG. 2 is a schematic plan view of the display device of FIG. 1.

Referring to FIG. 2, the display panel 100 may include gate lines GL, data lines DL, pixels SP, gate drivers GIC, gate control lines GCL, first and second floating lines FL1 and FL2, a first connecting line FCL1, a second connecting line FCL2, third connecting lines FCL3, fourth connecting lines FCL4, display pads DP, and gate pads GP.

The gate lines GL, the data lines DL, and the pixels SP may be disposed in the display area DA of the display panel 100.

The gate lines GL may extend in a first direction (or an X-axis direction) and may be spaced apart from one another in a second direction (or a Y-axis direction). The gate lines GL may provide gate signals from the gate drivers GIC to the pixels SP.

The data lines DL may extend in the second direction (or the Y-axis direction) and may be spaced apart from one another in the first direction (or the X-axis direction). The data lines DL may be electrically connected to the display drivers 300 through the display pads DP. The data lines DL may provide data voltages from the display drivers 300 to the pixels SP.

The pixels SP may include first pixels SP1, second pixels SP2, and third pixels SP3, and the first pixels SP1, the second pixels SP2, and the third pixels SP3 may emit light of different colors. Three pixels SP, i.e., first, second, and third pixels SP1, SP2, and SP3, may form a single pixel group, but the disclosure is not limited thereto. In other embodiments, four pixels SP may form a single pixel group.

The first pixels SP1, the second pixels SP2, and the third pixels SP3 may be arranged in the first direction (or the X-axis direction) and the second direction (or the Y-axis direction). The first pixels SP1, the second pixels SP2, and the third pixels SP3 may be arranged in a matrix. The first pixels SP1, the second pixels SP2, and the third pixels SP3 may be sequentially arranged in the first direction (or the X-axis direction). The first pixels SP1, the second pixels SP2, or the third pixels SP3 may be repeatedly arranged in columns in the second direction (or the Y-axis direction), but the disclosure is not limited thereto.

Each of the pixels SP may include first and second electrodes RME1 and RME2. The first and second electrodes RME1 and RME2 may extend in the second direction (or the Y-axis direction) and may be spaced apart from each other in the first direction (or the X-axis direction). The first and second electrodes RME1 and RME2 of one pixel SP may be insulated from the first and second electrodes RME1 and RME2 of another pixel SP. For example, the first and second electrodes RME1 and RME2 of a pixel SP may be spaced apart from the first and second electrodes RME1 and RME2, respectively, of a neighboring pixel SP, in the first direction (or the X-axis direction) or the second direction (or the Y-axis direction), of the former pixel SP. For example, the second electrode RME2 of one pixel SP may be electrically connected to the second electrode RME2 of a neighboring pixel SP, in the second direction (or the Y-axis direction), of the former pixel SP.

Multiple light-emitting elements may be disposed between the first and second electrodes RME1 and RME2 of each of the pixels SP. In each of the pixels SP, first ends of the light-emitting elements may be electrically connected to the first electrode RME1, and second ends of the light-emitting elements may be electrically connected to the second electrode RME2. In each of the pixels PX, the light-emitting elements may emit light in accordance with a driving current flowing from the first electrode RME1 to the second electrode RME2.

The gate drivers GIC, the gate control lines GCL, the first and second floating lines FL1 and FL2, the first connecting line FCL1, the second connecting line FCL2, the third connecting lines FCL3, the fourth connecting lines FCL4, the display pads DP, and the gate pads GP may be disposed in the non-display area NDA of the display panel 100.

The gate drivers GIC may be electrically connected to the gate pads GP through the gate control lines GCL. The gate drivers GIC may be electrically connected to the circuit boards 200 through the gate pads GP. The gate drivers GIC may generate gate signals based on the gate control signals from the circuit boards 200 and may sequentially provide the gate signals to the gate lines GL.

The gate drivers GIC may be disposed on the left and right edges of the non-display area NDA, but the disclosure is not limited thereto. In other embodiments, the gate drivers GIC may be disposed on only one of the left and right edges of the non-display area NDA.

The first and second floating lines FL1 and FL2, the first connecting line FCL1, the second connecting line FCL2, the third connecting lines FCL3, and the fourth connecting lines FCL4 may provide first and second alignment signals to the pixels SP during the fabrication of the display device 10. The first and second floating lines FL1 and FL2, the first connecting line FCL1, the second connecting line FCL2, the third connecting lines FCL3, and the fourth connecting lines FCL4 may be electrically connected to the first electrodes RME1 or the second electrodes RME2 of the pixels SP during the alignment of light-emitting elements. Once the alignment of light-emitting elements in each of the pixels SP is complete, the first and second floating lines FL1 and FL2, the first connecting line FCL1, the second connecting line FCL2, the third connecting lines FCL3, and the fourth connecting lines FCL4 may not be connected any longer to, but may be electrically isolated from, the first electrodes RME1 and the second electrodes RME2 of the pixels SP, the gate lines GL, and the data lines DL. Thus, in case that the manufacture of the display device 10 is complete, the first and second floating lines FL1 and FL2, the first connecting line FCL1, the second connecting line FCL2, the third connecting lines FCL3, and the fourth connecting lines FCL4 may no longer receive voltages. In other embodiments, the first and second floating lines FL1 and FL2, the first connecting line FCL1, the second connecting line FCL2, the third connecting lines FCL3, and the fourth connecting lines FCL4 may receive a ground voltage or a direct-current voltage with a predetermined or selectable level to prevent static electricity.

The first and second floating lines FL1 and FL2 may extend in the first direction (or the X-axis direction) and may be spaced apart from each other in the second direction (or the Y-axis direction). The first and second floating lines FL1 and FL2 may be disposed along the upper edge of the non-display area NDA.

The first floating line FL1 may be connected between the first connecting lines FCL1 and the third connecting lines FCL3. The first connecting line FCL1 and the third connecting lines FCL3 may extend in the second direction (or the Y-axis direction). The first connecting line FCL1 may extend from the first floating line FL1 toward the upper edge of the display panel 100. The third connecting lines FCL3 may extend from the first floating line FL1 toward the display area DA. The first connecting line FCL1 may be connected to first alignment pads (not illustrated) of a mother substrate (not illustrated).

The second floating line FL2 may be connected between the second connecting line FCL2 and the fourth connecting lines FCL4. The second connecting line FCL2 and the fourth connecting lines FCL4 may extend in the second direction (or the Y-axis direction). The second connecting line FCL2 may extend from the second floating line FL2 toward the upper edge of the display panel 100. The fourth connecting lines FCL4 may extend from the second floating line FL2 toward the display area DA. The second connecting line FCL2 may be connected to a second alignment pad of the mother substrate.

The display pads DP and the gate pads GP may be disposed along the lower edge of the non-display area NDA. The circuit boards 200, which may be disposed on the left or right sides of the non-display area NDA, may be connected to the display pads DP and the gate pads GP, and circuit boards 200 in the middle of the lower edge of the non-display area NDA may be connected to the display pads DP. Gate pads GP connected to circuit boards 200 disposed along the left part of the lower edge of the non-display are NDA may be disposed on the right side of the display pads DP.

Figure 3:
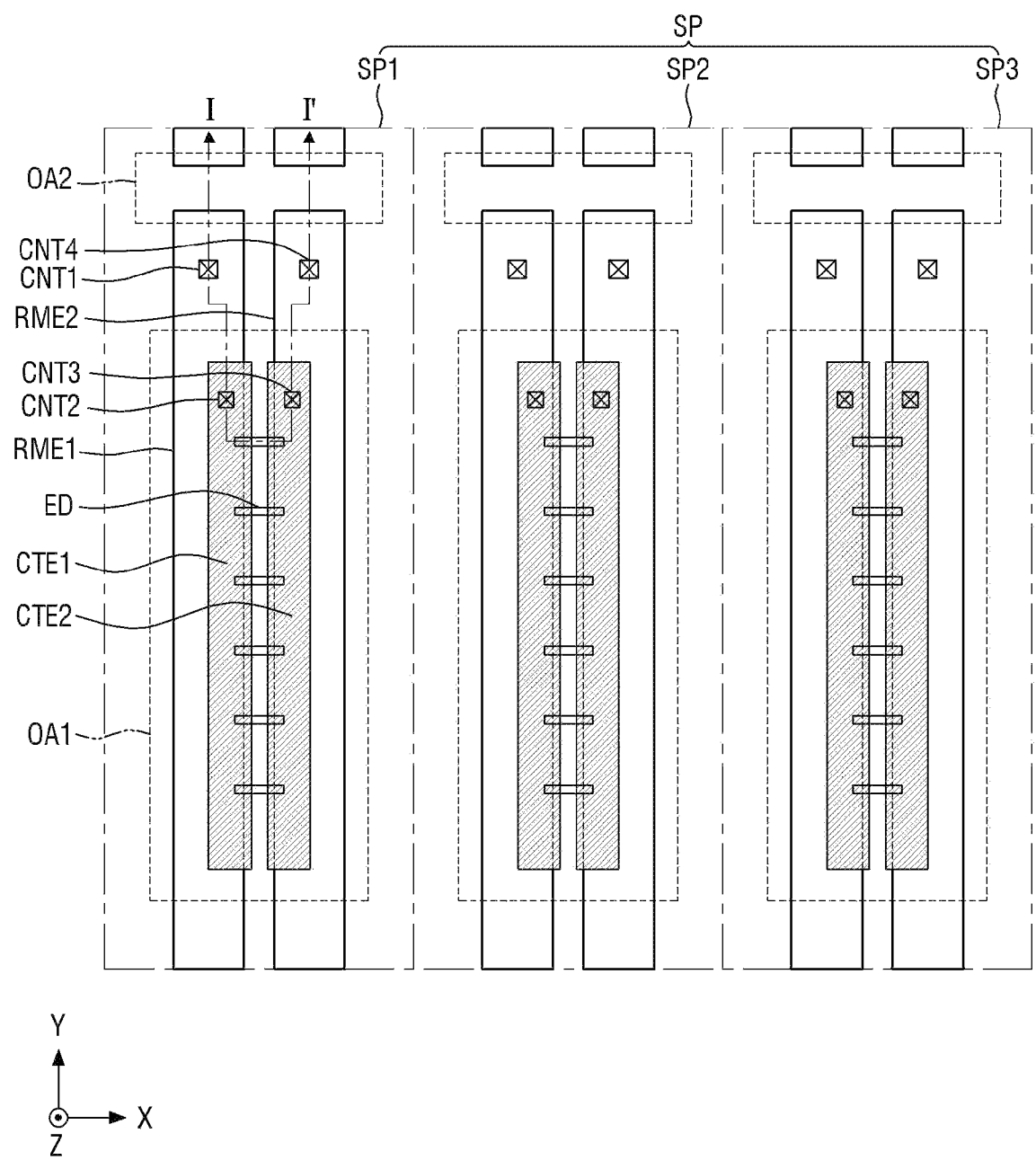
FIG. 3 is a schematic plan view of pixels of the display device of FIG. 1.

FIG. 3 is a schematic plan view of pixels of the display device of FIG. 1.

Referring to FIG. 3, pixels SP may include first, second, and third pixels SP1, SP2, and SP3, which may emit light of different colors. Three pixels SP may form a single pixel group, but the number of pixels SP forming a single pixel group is not particularly limited. In other embodiments, four pixels SP may form a single pixel group. Each of the pixels SP may be defined as a minimal unit for emitting light.

The first pixel SP1 may emit first-color light, the second pixel SP2 may emit second-color light, and the third pixel SP3 may emit third-color light. For example, the first-color light may be red light having a peak wavelength of 610 nm to 650 nm, the second-color light may be green light having a peak wavelength of 510 nm to 550 nm, and the third-color light may be blue light having a peak wavelength of 440 nm to 480 nm. However, the disclosure is not limited to this example.

Each of the first, second, and third pixels SP1, SP2, and SP3 may include a first electrode RME1, a second electrode RME2, a first contact electrode CTE1, a second contact electrode CTE2, and light-emitting elements ED.

The first electrodes RME1 of the first, second, and third pixels SP1, SP2, and SP3 may be pixel electrodes that are separate between the first, second, and third pixels SP1, SP2, and SP3, and the second electrodes RME2 of the first, second, and third pixels SP1, SP2, and SP3 may be common electrodes that are separate between the first, second, and third pixels SP1, SP2, and SP3. For example, the first electrode RME1 of each of the first, second, and third pixels SP1, SP2, and SP3 may be an anode electrically connected to first ends of light-emitting elements ED, and the second electrode RME2 of each of the first, second, and third pixels SP1, SP2, and SP3 may be a cathode electrically connected to second ends of the light-emitting elements ED. The first and second electrodes RME1 and RME2 of each of the first, second, and third pixels SP1, SP2, and SP3 may extend in the second direction (or the Y-axis direction). The first and second electrodes RME1 and RME2 of each of the first, second, and third pixels SP1, SP2, and SP3 may be spaced apart from each other in the first direction (or the X-axis direction) and may be electrically insulated from each other.

The first electrode RME1 of each of the first, second, and third pixels SP1, SP2, and SP3 may be connected to a pixel circuit through a first contact hole CNT1. The first electrode RME1 of each of the first, second, and third pixels SP1, SP2, and SP3 may be electrically connected to the source or drain electrode of a thin-film transistor (TFT) through the first contact hole CNT1. The second electrode RME2 of each of the first, second, and third pixels SP1, SP2, and SP3 may be electrically connected to a power line through a fourth contact hole CNT4.

Each of the first, second, and third pixels SP1, SP2, and SP3 may include one first electrode RME1 and one second electrode RME2, but the disclosure is not limited thereto. In other embodiments, each of the first, second, and third pixels SP1, SP2, and SP3 may include two or more first electrodes RME1 or two or more second electrodes RME2. In other embodiments, each of the first, second, and third pixels SP1, SP2, and SP3 may include one first electrode RME1 and two second electrodes RME2.

The first and second contact electrodes CTE1 and CTE2 of each of the first, second, and third pixels SP1, SP2, and SP3 may extend in the second direction (or the Y-axis direction). The first and second contact electrodes CTE1 and CTE2 of each of the first, second, and third pixels SP1, SP2, and SP3 may be spaced apart from each other in the first direction (or the X-axis direction) and may be electrically insulated from each other. The length, in the second direction (or the Y-axis direction), of the first contact electrode CTE1 and the second contact electrode CTE2 of each of the first, second, and third pixels SP1, SP2, and SP3 may be less than the length, in the second direction (or the Y-axis direction), of the first electrode RME1 and the second electrode RME2 of each of the first, second, and third pixels SP1, SP2, and SP3. The length, in the first direction (or the X-axis direction), of the first contact electrode CTE1 of each of the first, second, and third pixels SP1, SP2, and SP3 may be less than the length, in the first direction (or the X-axis direction), of the first electrode RME1 of each of the first, second, and third pixels SP1, SP2, and SP3. The length, in the first direction (or the X-axis direction), of the second contact electrode CTE2 of each of the first, second, and third pixels SP1, SP2, and SP3 may be less than the length, in the first direction (or the X-axis direction), of the second electrode RME2 of each of the first, second, and third pixels SP1, SP2, and SP3.

In each of the first, second, and third pixels SP1, SP2, and SP3, the first contact electrode CTE1 may overlap the first electrode RME1 in a third direction (or a Z-axis direction) and may be connected to the first electrode RME1 through a second contact hole CNT2. In each of the first, second, and third pixels SP1, SP2, and SP3, the second contact electrode CTE2 may overlap the second electrode RME2 in the third direction (or the Z-axis direction) and may be connected to the second electrode RME2 through a third contact hole CNT3.

In each of the first, second, and third pixels SP1, SP2, and SP3, the first contact electrode CTE1 may be in contact with the first ends of the light-emitting elements ED, and the second contact electrode CTE2 may be in contact with the second ends of the light-emitting elements ED. Thus, in each of the first, second, and third pixels SP1, SP2, and SP3, the first ends of the light-emitting elements ED may be electrically connected to the first electrode RME1 through the first contact electrode CTE1, and the second ends of the light-emitting elements ED may be electrically connected to the second electrode RME2 through the second contact electrode CTE2.

The light-emitting elements ED of each of the first, second, and third pixels SP1, SP2, and SP3 may be spaced apart from one another. The light-emitting elements ED of each of the first, second, and third pixels SP1, SP2, and SP3 may extend in the first direction (or the X-axis direction) and may be spaced apart from one another in the second direction (or the Y-axis direction). The light-emitting elements ED of each of the first, second, and third pixels SP1, SP2, and SP3 may be disposed in a first opening area OA1, which may be defined by a bank or a pixel-defining film. In each of the first, second, and third pixels SP1, SP2, and SP3, the first ends of the light-emitting elements ED may be in contact with the first contact electrode CTE1, and the second ends of the light-emitting elements ED may be in contact with the second contact electrode CTE2. In each of the first, second, and third pixels SP1, SP2, and SP3, the first ends of the light-emitting elements ED may overlap the first electrode RME1 in the third direction (or the Z-axis direction), and the second ends of the light-emitting elements ED may overlap the second electrode RME2 in the third direction (or the Z-axis direction).

The light-emitting elements ED of each of the first, second, and third pixels SP1, SP2, and SP3 may have a rod, wire, or tube shape. For example, the light-emitting elements ED of each of the first, second, and third pixels SP1, SP2, and SP3 may have a cylindrical or rod shape. In another example, the light-emitting elements ED of each of the first, second, and third pixels SP1, SP2, and SP3 may have a polyhedral shape such as a cube shape or a rectangular parallelepiped shape or a polygonal prism shape such as a hexagonal prism shape. In another example, the light-emitting elements ED of each of the first, second, and third pixels SP1, SP2, and SP3 may have a truncated cone shape extending in a direction and having a partially inclined shape. The light-emitting elements ED of each of the first, second, and third pixels SP1, SP2, and SP3 may have a size of several micro-meters or nano-meters and may be inorganic LEDs including an inorganic semiconductor. In each of the first, second, and third pixels SP1, SP2, and SP3, the light-emitting elements ED may be aligned between the first and second electrodes RME1 and RME2 by an electric field formed in a particular direction between the first and second electrodes RME1 and RME2, which face each other.

In each of the first, second, and third pixels SP1, SP2, and SP3, the bank or the pixel-defining film may define the first opening area OA1 or a second opening OA2. The first opening area OA1 may be an emission area where light-emitting elements ED may be disposed. The second opening area OA2 may be an area where first and second electrodes RME1 and RME2 of a pixel SP are separated from first and second electrodes RME1 and RME2 of another pixel SP. The first electrodes RME1 of two adjacent pixels SP in the second direction (or the Y-axis direction) may be spaced apart from each other by the second opening area OA2 of one of the two adjacent pixels SP. The second electrodes RME2 of two adjacent pixels SP in the second direction (or the Y-axis direction) may be spaced apart from each other by the second opening area OA2 of one of the two adjacent pixels SP.

In some embodiments, the first and second opening areas OA1 and OA2 of each of the first, second, and third pixels SP1, SP2, and SP3 may be formed as a single opening area.

Figure 4:
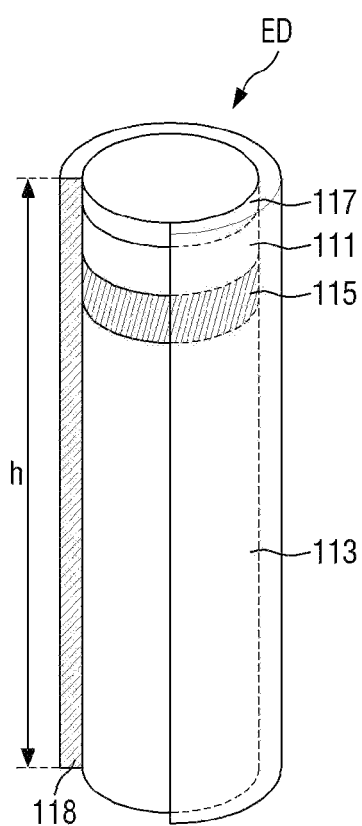
FIG. 4 is a schematic perspective view of a light-emitting element of the display device of FIG. 1.

FIG. 4 is a schematic perspective view of a light-emitting element of the display device of FIG. 1.

Referring to FIG. 4, a light-emitting element ED may include a first semiconductor part 111, a second semiconductor part 113, an active layer 115, an electrode layer 117, and an insulating film 118.

The first semiconductor part 111 may be disposed on the active layer 115. The first semiconductor part 111 may be electrically connected to the first electrode RME1 through the electrode layer 117 and the first contact electrode CTE1. For example, in a case where the light-emitting element ED emits blue light or green light, the first semiconductor part 111 may include a semiconductor material, i.e., $Al_xGa_yIn_{1-x-y}N$ (where $0 \leq x \leq 1$, $0 \leq y \leq 1$, and $0 \leq x+y \leq 1$). For example, the first semiconductor part 111 may include at least one semiconductor material doped with a p-type dopant, such as AlGaInN, GaN, AlGaN, InGaN, AlN, or InN, or a combination thereof. The first semiconductor part 111 may be p-GaN, which may be doped with magnesium (Mg), a p-type dopant. The first semiconductor part 111 may have a length of 0.05 μm to 0.10 μm, but the disclosure is not limited thereto.

The second semiconductor part 113 may be electrically connected to the second electrode RME2 through the second contact electrode CTE2. The second semiconductor part 113 may include an n-type semiconductor. For example, in a case where the light-emitting element ED emits blue light, the second semiconductor part 113 may include a semiconductor material, i.e., $Al_xGa_yIn_{1-x-y}N$ (where $0 \leq x \leq 1$, $0 \leq y \leq 1$, and $0 \leq x+y \leq 1$). For example, the second semiconductor part 113 may include at least one semiconductor material doped with an n-type dopant, such as AlGaInN, GaN, AlGaN, InGaN, AlN, or InN. The second semiconductor part 113 may be n-GaN, which may be doped with silicon (Si), an n-type dopant. The second semiconductor part 113 may have a length of 1.5 μm to 5 μm, but the disclosure is not limited thereto.

Each of the first and second semiconductor parts 111 and 113 may be formed as a single layer. For example, each of the first and second semiconductor parts 111 and 113 may include layers such as a clad layer or a tensile strain barrier reducing (TSBR) layer.

The active layer 115 may be disposed between the first and second semiconductor parts 111 and 113. The active layer 115 may include a material having a single- or multi-quantum well structure. Multiple quantum layers and multiple well layers may be alternately stacked on each other in the active layer 115. As electron-hole pairs combine together in response to electrical signals applied to the active layer 115 through the first and second semiconductor parts 111 and 113, the active layer 115 may emit light. For example, in a case where the active layer 115 includes a material such as AlGaN or AlGaInN, the active layer 115 may emit blue light. In a case where the active layer 114 has a multi-quantum well structure where quantum layers and well layers may be alternately stacked on each other, the quantum layers may include a material such as AlGaN or AlGaInN, and the well layers may include a material such as GaN or AlInN, in which case, the active layer 115 may emit blue light.

In other embodiments, the active layer 115 may have a structure where a semiconductor material with a large bandgap energy and a semiconductor material with a small bandgap energy may be alternately stacked on each other and may include a group-III semiconductor material, a group-IV semiconductor material, and/or group-V semiconductor materials depending on the wavelength band of light emitted by the active layer 115. The color of light emitted by the active layer 115 is not particularly limited, and the active layer 115 may emit red light or green light. The active layer 115 may have a length of 0.05 μm or 0.10 μm, but the disclosure is not limited thereto.

Light emitted by the active layer 115 may be output in the longitudinal direction of the light-emitting element ED and through both sides of the light-emitting element ED. The directivity of light emitted by the active layer 115 is not particularly limited.

The electrode layer 117 may be an ohmic contact electrode. In other embodiments, the electrode layer 117 may be a Schottky contact electrode. The light-emitting element ED may include at least one electrode layer 117. The electrode layer 117 may reduce the resistance between the light-emitting element ED and a first contact electrode CTE1 in case that the light-emitting element ED is connected to the first contact electrode CTE1. The electrode layer 117 may include a conductive metal. For example, the electrode layer 117 may include at least one of aluminum (Al), titanium (Ti), indium (In), gold (Au), silver (Ag), indium tin oxide (ITO), indium zinc oxide (IZO), and indium tin zinc oxide (ITZO). The electrode layer 117 may include a semiconductor material doped with an n- or p-type dopant.

The insulating film 118 may surround the outer surfaces of the first semiconductor part 111, the second semiconductor part 113, the active layer 115, and the electrode layer 117. The insulating film 118 may protect the light-emitting element ED. For example, the insulating film 118 may surround the side of the light-emitting element ED and may expose both ends, in the longitudinal direction, of the light-emitting element ED.

The insulating film 118 may include an insulating material such as, for example, silicon oxide ($SiO_x$), silicon nitride ($SiN_x$), silicon oxynitride ($SiO_xN_y$), aluminum nitride (AlN), or aluminum oxide ($Al_2O_3$). Thus, the insulating film 118 may prevent any electrical short circuit that may occur in case that the active layer 115 is placed in direct contact with an electrode of the light-emitting element ED to which an electrical signal may be transmitted. The insulating layer 118 may protect the outer surface of the light-emitting element ED and may thus prevent a decrease in the emission efficiency of the light-emitting element ED.

The outer surface of the insulating film 118 may be surface-treated. During the fabrication of the display panel 100, the light-emitting element ED may be sprayed onto each electrode while being dispersed in predetermined or selectable ink, and may thus be aligned. As the surface of the insulating film 118 may be hydrophobically or hydrophilically treated, the light-emitting element ED may be able to remain dispersed in ink without agglomerating with other light-emitting elements ED.

Figure 5:
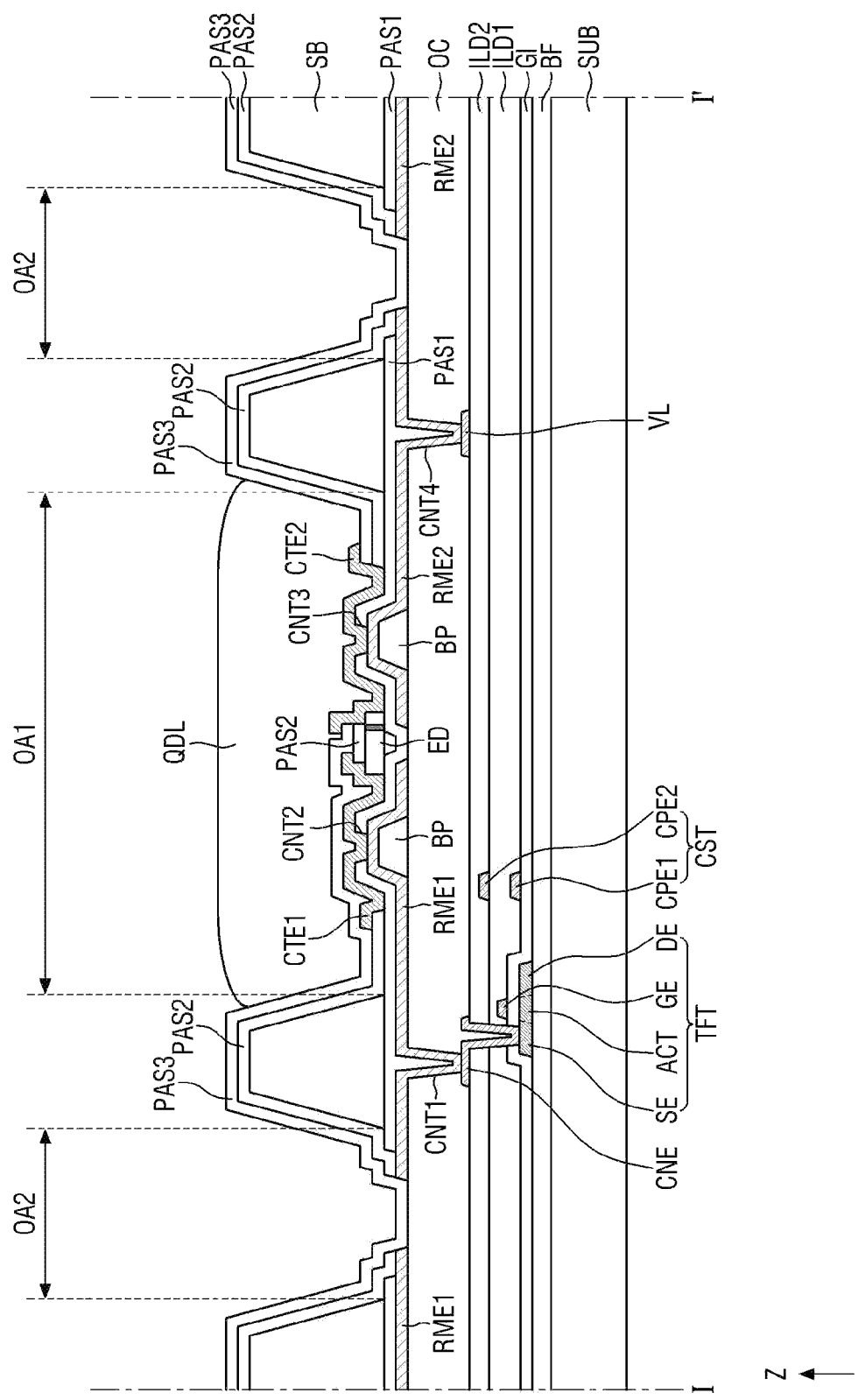
FIG. 5 is a schematic cross-sectional view taken along line I-I' of FIG. 3.

FIG. 5 is a schematic cross-sectional view taken along line I-I' of FIG. 3.

Referring to FIG. 5, the display panel 100 may include a substrate SUB, a buffer layer BF, a TFT "TFT", a gate insulating film GI, a storage capacitor CST, first and second interlayer insulating films ILD1 and ILD2, a connecting electrode CNE, a power line VL, a planarization layer OC, bank patterns BP, a first electrode RME1, a second electrode RME2, a first insulating film PAS1, a bank SB, light-emitting elements ED, a second insulating film PAS2, a first contact electrode CTE1, a second contact electrode CTE2, a third insulating film PAS3, and a wavelength conversion layer QDL.

The substrate SUB may be a base substrate or a base member. The substrate SUB may support the display panel 100. The substrate SUB may be a flexible substrate that is bendable, foldable, and/or rollable. For example, the substrate SUB may include a polymer resin such as polyimide, but the disclosure is not limited thereto. In another example, the substrate SUB may include a glass material or a metallic material.

The buffer layer BF may be disposed on the substrate SUB. The buffer layer BF may include an inorganic material capable of preventing the penetration of the air or moisture. For example, the buffer layer BF may include inorganic films that are alternately stacked on each other.

The TFT "TFT" may be disposed on the buffer layer BF and may form a pixel circuit of a pixel SP. For example, the TFT "TFT" may be a driving or switching transistor. The TFT "TFT" may include a semiconductor region ACT, a drain electrode DE, a source electrode SE, and a gate electrode GE.

The semiconductor region ACT, the drain electrode DE, and the source electrode SE may be disposed on the buffer layer BF. The semiconductor region ACT may overlap the gate electrode GE in a thickness direction and may be insulated from the gate electrode GE by the gate insulating film GI. The drain electrode DE and the source electrode SE may be obtained by forming conductors with the material of the semiconductor region ACT.

The gate electrode GE may be disposed on the gate insulating film GI. The gate electrode GE may overlap the semiconductor region ACT with the gate insulating film GI interposed therebetween.

The gate insulating film GI may be disposed on the semiconductor region ACT, the drain electrode DE, and the source electrode SE. For example, the gate insulating film GI may cover the semiconductor region ACT, the drain electrode DE, the source electrode SE, and the buffer layer BF and may insulate the semiconductor region ACT and the gate electrode GE.

The storage capacitor CST may include first and second capacitor electrodes CPE1 and CPE2. The first capacitor electrode CPE1 may be disposed on the gate insulating film GI, and the second capacitor electrode CPE2 may be disposed on the first interlayer insulating film ILD1. As the first and second capacitor electrodes CPE1 and CPE2 overlap each other in the third direction (or the Z-axis direction), capacitance may be formed between the first and second capacitor electrodes CPE1 and CPE2.

The first interlayer insulating film ILD1 may be disposed on the gate electrode GE, the first capacitor electrode CPE1, and the gate insulating film GI. The second interlayer insulating film ILD2 may be disposed on the second capacitor electrode CPE2 and the first interlayer insulating film ILD1. Each of the first interlayer insulating film ILD1, the second interlayer insulating film ILD2, and the gate insulating film GI may include a contact hole that may be penetrated by the connecting electrode CNE.

The connecting electrode CNE may be disposed on the second interlayer insulating film ILD2. The connecting electrode CNE may electrically connect the source electrode SE of the TFT "TFT" and the first electrode RME1. The connecting electrode CNE may be connected to the source electrode SE through the contact hole formed in each of the first interlayer insulating film ILD1, the second interlayer insulating film ILD2, and the gate insulating film GI.

The power line VL may be spaced apart from the connecting electrode CNE, on the second interlayer insulating film ILD2. The power line VL may be connected to the second electrode RME2, which may be inserted in a fourth contact hole CNT4. The power line VL may be a low-potential line supplying a low-potential voltage to the second electrode RME2, but the disclosure is not limited thereto.

The planarization layer OC may be disposed on the connecting electrode CNE, the power line VL, and the second interlayer insulating film ILD2 and may planarize the top of the TFT "TFT". The planarization layer OC may include a first contact hole CNT1, which may be penetrated by the first electrode RME1, and the fourth contact hole CNT4, which may be penetrated by the second electrode RME2. The planarization layer OC may include an organic material.

The bank patterns BP may be disposed on the planarization layer OC. The bank patterns BP may protrude at least in part from the top surface of the planarization layer OC. The bank patterns BP may be disposed in a first opening area OA1 of the pixel SP. The light-emitting elements ED may be disposed between the bank patterns BP. Each of the bank patterns BP may have inclined sides, and light emitted by the light-emitting elements ED may be reflected by the first and second electrodes RME1 and RME2 on the bank patterns BP. For example, the bank patterns BP may include an organic insulating material such as polyimide.

The first electrode RME1 may be disposed on the planarization layer OC and the bank patterns BP. The first electrode RME1 may be disposed on a bank pattern BP on a side of each of the light-emitting elements ED. The first electrode RME1 may be disposed on an inclined side of one of the bank patterns BP to reflect light emitted by the light-emitting elements ED. The first electrode RME1 may be inserted in the first contact hole CNT1, which may be provided in the planarization layer OC, and may thus be connected to the connecting electrode CNE. The first electrode RME1 may be electrically connected to the first ends of the light-emitting elements ED through the first contact electrode CTE1. For example, the first electrode RME1 may receive a voltage corresponding to the luminance of the light-emitting element ED from the pixel circuit of the pixel SP.

The second electrode RME2 may be disposed on the planarization layer OC and the bank patterns BP. The second electrode RME2 may be disposed on a bank pattern BP on the other side of each of the light-emitting elements ED. The second electrode RME2 may be disposed on an inclined side of one of the bank patterns BP to reflect light emitted by the light-emitting elements ED. The second electrode RME2 may be electrically connected to the second ends of the light-emitting elements ED through the second contact electrode CTE2. For example, the second electrode RME2 may receive a low-potential voltage from the power line VL.

The first and second electrodes RME1 and RME2 may include a conductive material with high reflectance. For example, the first and second electrodes RME1 and RME2 may include at least one of Ag, copper (Cu), aluminum (Al), nickel (Ni), and lanthanum (La). In another example, the first and second electrodes RME1 and RME2 may include a material such as ITO, IZO, and/or ITZO. In another example, each of the first and second electrodes RME1 and RME2 may include multiple layers of a transparent conductive material and a metal with high reflectance, or may include a single layer including a transparent conductive material and a metal with high reflectance. The first and second electrodes RME1 and RME2 may have a stack of ITO/Ag/ITO/, ITO/Ag/IZO, or ITO/Ag/ITZO/IZO.

The first insulating film PAS1 may be disposed on the planarization layer OC and the first and second electrodes RME1 and RME2. The first insulating film PAS1 may protect and insulate the first and second electrodes RME1 and RME2. The first insulating film PAS1 may prevent the light-emitting elements ED from being in direct contact with, and damaged by, the first and second electrodes RME1 and RME2 during the alignment of the light-emitting elements ED.

The bank SB may be disposed between the first and second opening areas OA1 and OA2, on the first insulating film PAS1. The bank SB may be disposed along the boundaries of the pixel SP to separate the light-emitting elements ED of the pixel SP from light-emitting elements ED of another pixel SP. The bank SB may have a predetermined or selectable height and may include an organic insulating material such as polyimide.

The light-emitting elements ED may be disposed on the first insulating film PAS1. The light-emitting elements ED may be aligned in parallel to one another between the first and second electrodes RME1 and RME2. The length of the light-emitting elements ED may be greater than the distance between the first and second electrodes RME1 and RME2. Each of the light-emitting elements ED may include semiconductor layers, and the first and second ends of each of the light-emitting elements ED may be defined based on the semiconductor layers. The first ends of the light-emitting elements ED may be disposed on the first electrode RME1, and the second ends of the light-emitting elements ED may be disposed on the second electrode RME2. The first ends of the light-emitting elements ED may be electrically connected to the first electrode RME1 through the first contact electrode CTE1, and the second ends of the light-emitting elements ED may be electrically connected to the second electrode RME2 through the second contact electrode CTE2.

The light-emitting elements ED may have a size of several micro-meters or nano-meters and may be inorganic LEDs including an inorganic semiconductor. The light-emitting elements ED may be aligned between the first and second electrodes RME1 and RME2 by an electric field formed in a particular direction between the first and second electrodes RME1 and RME2, which face each other.

The second insulating film PAS2 may be disposed on the light-emitting elements ED, the bank SB, and the first insulating film PAS1. For example, the second insulating film PAS2 may partially cover the light-emitting elements ED, but may not cover both ends of each of the light-emitting elements ED. The second insulating film PAS2 may protect and fix the light-emitting elements ED during the manufacture of the display device 10. The second insulating film PAS2 may fill the space between the first insulating film PAS1 and the light-emitting elements ED.

The first contact electrode CTE1 may be disposed on the first insulating film PAS1 and may be inserted in a second contact hole CNT2, which is provided in the first insulating film PAS1, to be connected to the first electrode RME1. For example, the second contact hole CNT2 may be provided on one of the bank patterns BP, but the disclosure is not limited thereto. An end of the first contact electrode CTE1 may be connected to the first electrode RME1, on one of the bank patterns BP, and another end of the first contact electrode CTE1 may be connected to the first ends of the light-emitting elements ED.

The second contact electrode CTE2 may be disposed on the first insulating film PAS1 and may be inserted in a third contact hole CNT3, which may be provided in the first insulating film PAS1, to be connected to the second electrode RME2. For example, the third contact hole CNT3 may be provided on one of the bank patterns BP, but the disclosure is not limited thereto. An end of the second contact electrode CTE2 may be connected to the second ends of the light-emitting elements ED, and another end of the second contact electrode CTE2 may be connected to the second electrode RME2, on one of the bank patterns BP.

The third insulating film PAS3 may be disposed on the first contact electrode CTE1 and the second insulating film PAS2. The third insulating film PAS3 may insulate the first and second contact electrodes CTE1 and CTE2.

The wavelength conversion layer QDL may be disposed on the third insulating film PAS3 and the second contact electrode CTE2, in the first opening area OA1. The wavelength conversion layer QDL may be surrounded by the bank SB, in a plan view. The wavelength conversion layer QDL may convert or shift the peak wavelength of incident light. For example, the wavelength conversion layer QDL may convert blue light from the light-emitting elements ED into red or green light and may output the red or green light. In another example, the wavelength conversion layer QDL may transmit blue light from the light-emitting elements ED therethrough.

Figure 6:
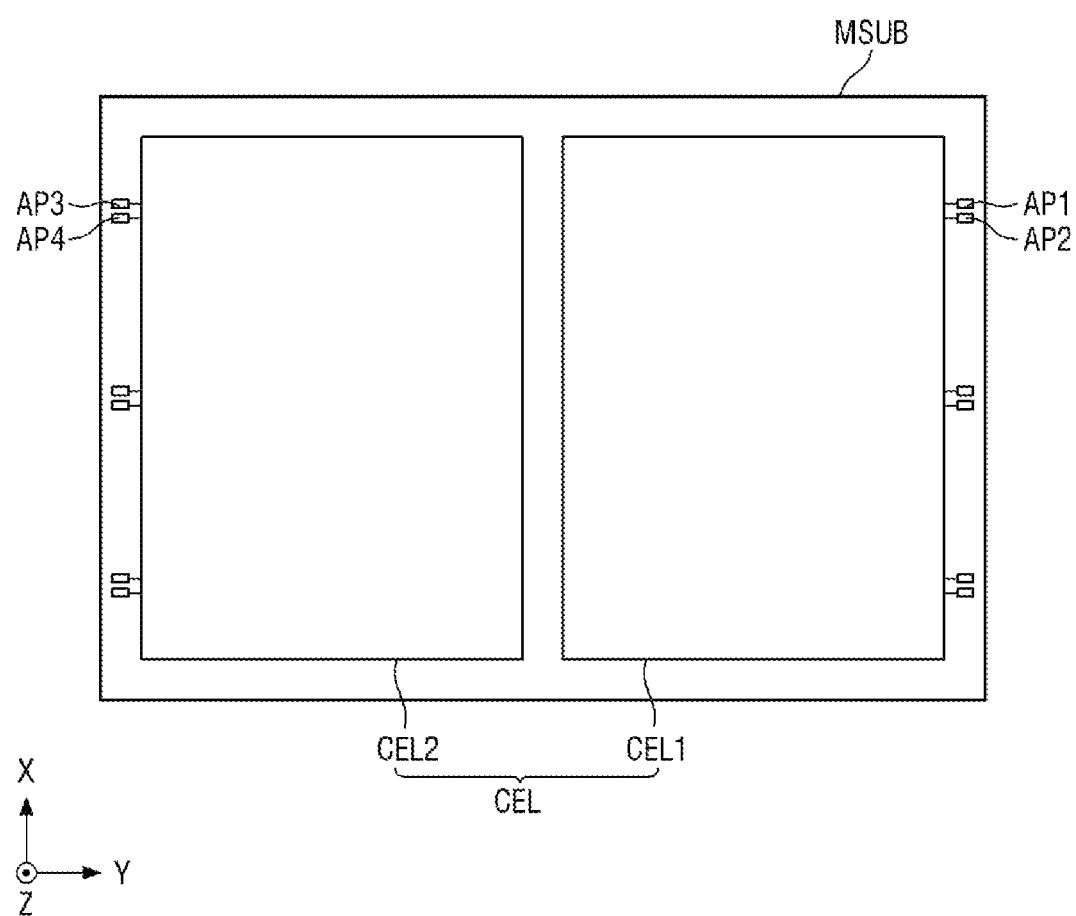
FIG. 6 is a schematic plan view of a mother substrate according to an embodiment of the disclosure.
Figure 7:
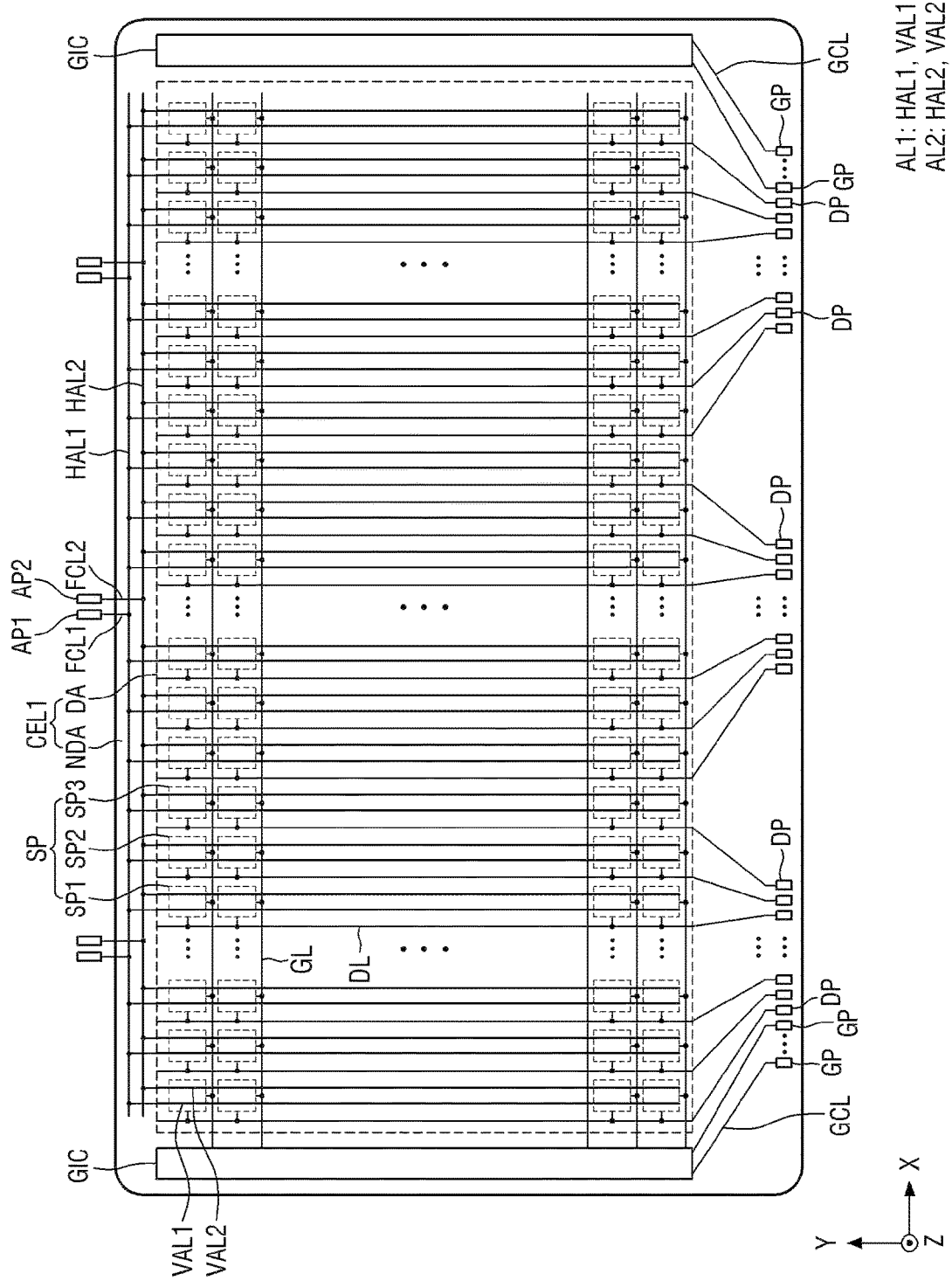
FIG. 7 is a schematic plan view of a panel cell of FIG. 6.

FIG. 6 is a schematic plan view of a mother substrate according to an embodiment of the disclosure, and FIG. 7 is a schematic plan view of a panel cell of FIG. 6. Descriptions of elements or features that have already been described will be omitted or simplified.

Referring to FIGS. 6 and 7, a mother substrate MSUB may include a first panel cell CEL1, a second panel cell CEL2, first alignment pads AP1, second alignment pads AP2, third alignment pads AP3, and fourth alignment pads AP4. The mother substrate MSUB may include two panel cells, i.e., the first and second panel cells CEL1 and CEL2, but the number of panel cells included in the mother substrate MSUB is not particularly limited.

The first panel cell CEL1 may be disposed on a first side of the mother substrate MSUB, and the second panel cell CEL2 may be disposed on a second side of the mother substrate MSUB. The first and second panel cells CEL1 and CEL2 may be symmetrical with respect to an axis in the second direction (or the Y-axis direction). The first alignment pads AP1 and the second alignment pads AP2 may be symmetrical with the third alignment pads AP3 and the fourth alignment pads AP4 with respect to the axis in the second direction (or the Y-axis direction). For example, the first alignment pads AP1 and the second alignment pads AP2 may be disposed on the right side of the first panel cell CEL1, and the third alignment pads AP3 and the fourth alignment pads AP4 may be disposed on the left side of the second panel cell CEL2.

Referring to FIG. 7, the first panel cell CEL1 may include pixels SP, gate drivers GIC, gate lines GL, data lines DL, first alignment lines AL1, second alignment lines AL2, first connecting lines FCL1, second connecting lines FCL2, display pads DP, and gate pads GP.

The first alignment lines AL1 may include a first horizontal alignment line HAL1 and first vertical alignment lines VAL1. The first horizontal alignment line HAL1 may be substantially the same as the first floating line FL1 of FIG. 2. The first horizontal alignment line HAL1 may be electrically connected to the first alignment pads AP1 through the first connecting lines FCL1. The first vertical alignment line VAL1 may extend from the first horizontal alignment line HAL1 in the second direction (or the Y-axis direction). The first vertical alignment lines VAL1 may be connected to first pixels SP1, second pixels SP2, and third pixels SP3, which may be arranged in columns in the second direction (or the Y-axis direction).

The second alignment lines AL2 may include a second horizontal alignment line HAL2 and second vertical alignment lines VAL2. The second horizontal alignment line HAL2 may be substantially the same as the second floating line FL2 of FIG. 2. The second horizontal alignment line HAL2 may be electrically connected to the second alignment pads AP2 through the second connecting lines FCL2. The second vertical alignment line VAL2 may extend from the second horizontal alignment line HAL2 in the second direction (or the Y-axis direction). The second vertical alignment line VAL2 may be connected to the first pixels SP1, the second pixels SP2, and the third pixels SP3, which are arranged in columns in the second direction (or the Y-axis direction).

The first alignment lines AL1 may be electrically connected to the first alignment pads AP1 through the first connecting lines FCL1, and the second alignment lines AL2 may be electrically connected to the second alignment pads AP2 through the second connecting lines FCL2. The first vertical alignment lines VAL1 and the second vertical alignment lines VAL2 may be disposed in all the pixels SP of the display panel 100, and a second alignment signal may be applied to the second alignment lines AL2 through the second alignment pads AP2. Multiple light-emitting elements ED may be aligned between the first vertical alignment lines VAL1 and the second vertical alignment lines VAL2 by an electric field formed by the first alignment signal from the first alignment lines AL1 and the second alignment signal from the second alignment lines AL2.

The first vertical alignment lines VAL1 and the second vertical alignment lines VAL2 may be disconnected after the alignment of the light-emitting elements ED. Thus, the first vertical alignment lines VAL1 may be divided into the third connecting lines FCL3 of FIG. 2 and multiple first electrodes RME1, and the second vertical alignment lines VAL2 may be divided into the fourth connecting lines FCL4 of FIG. 2 and multiple second electrodes RME2.

The first and second panel cells CEL1 and CEL2 may be cut by a scribing process. Thus, each of the first and second panel cells CEL1 and CEL2 may be formed as the display panel 100 of FIG. 2.

Figure 8:
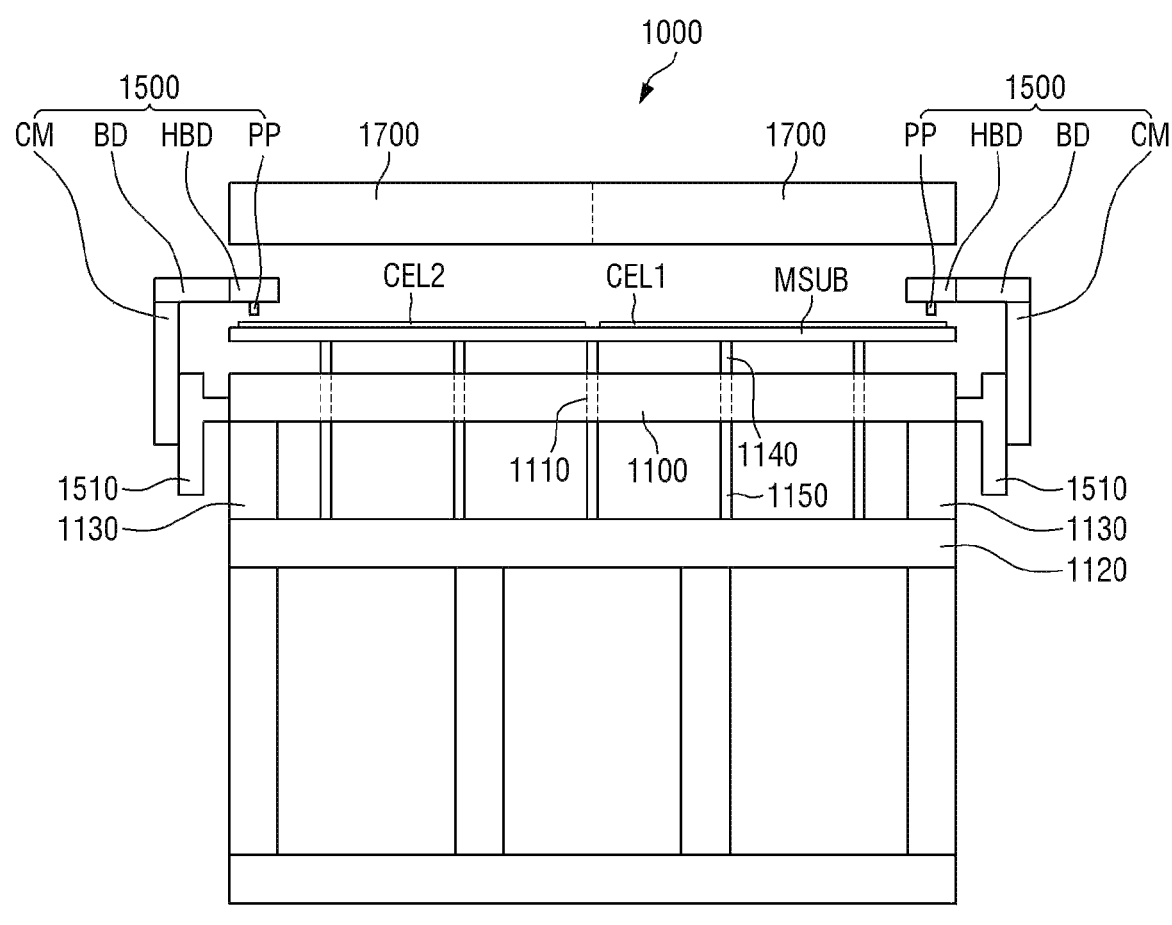
FIG. 8 is a schematic cross-sectional view of an apparatus for manufacturing a display device according to an embodiment of the disclosure.
Figure 9:
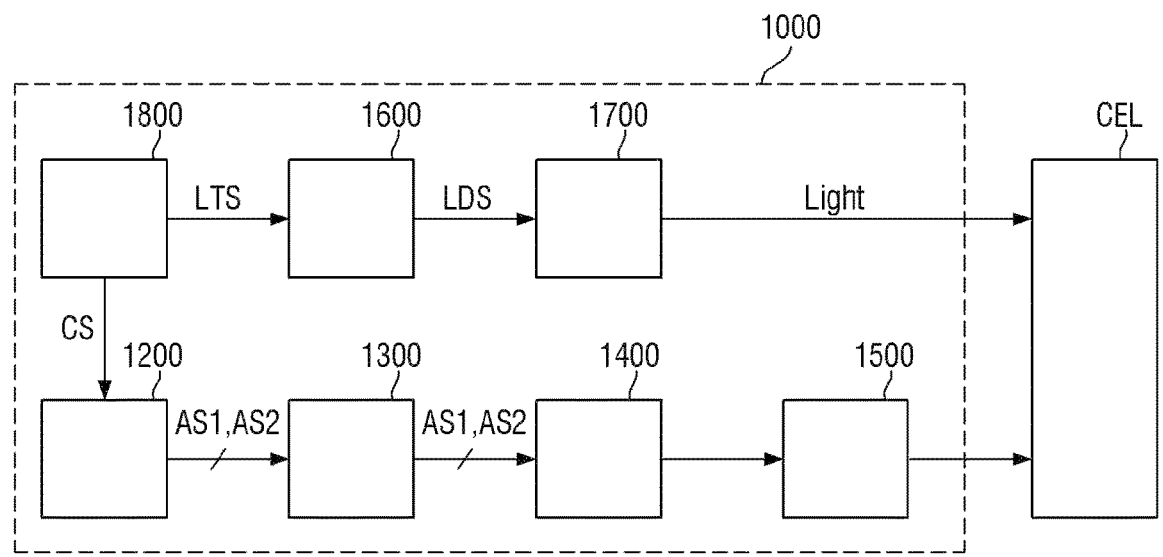
FIG. 9 is a schematic block diagram of the apparatus of FIG. 8.

FIG. 8 is a schematic cross-sectional view of an apparatus for manufacturing a display device according to an embodiment of the disclosure, and FIG. 9 is a schematic block diagram of the apparatus of FIG. 8.

Referring to FIGS. 8 and 9, an apparatus 1000 for manufacturing a display device may provide alignment signals to each of multiple panel cells CEL. The apparatus 1000 may provide alignment signals to a first panel cell CEL1 through first alignment pads AP1 and second alignment pads AP2 and to a second panel cell CEL2 through third alignment pads AP3 and fourth alignment pads AP4. The apparatus 1000 may align light-emitting elements ED in each of the first pixels SP1, the second pixels SP2, and the third pixels SP3 by applying alignment signals to each of the first and second panel cells CEL1 and CEL2.

The apparatus 1000 may include a stage 1100, stage holes 1110, a stage support 1120, a stage mover 1130, supporting pins 1140, pin supports 1150, a voltage output unit 1200 (voltage output), an amplifier 1300, a switching unit 1400, a field application unit 1500 (field application part), a probe moving unit 1510, an emission driver 1600, a light irradiation unit 1700 (light irradiation part), and a control unit 1800 (controller).

The stage 1100 may have a flat top surface and may stably support the mother substrate MSUB. The stage 1100 may be lifted up or down by the stage moving unit 1130. The stage 1100 may include the stage holes 1110, which penetrate the stage 1100. The supporting pins 1140 and the pin supports 1150 may penetrate the stage holes 1110. The stage holes 1110 may be arranged in the first direction (or the X-axis direction) and the second direction (or the Y-axis direction). For example, the stage holes 1110 may be arranged in the first direction (or the X-axis direction) at intervals of a first distance and in the second direction (or the Y-axis direction) at intervals of a second distance.

The stage support 1120 may be disposed below the stage 1100 and may support the stage 1100. The stage moving unit 1130 and the pin supports 1150 may be disposed on the stage support 1120. The stage support 1120 may have various shapes.

The stage moving unit 1130 may be connected to the bottom of the stage 1100. The stage moving unit 1130 may support the edges of the bottom of the stage 1100. The stage moving unit 1130 may lift up or down the stage 1100 based on a stage control signal from the control unit 1800. The stage moving unit 1130 may include a motor as a power source for moving the stage 1100.

In response to a stage control signal with a first voltage being received from the control unit 1800, the stage moving unit 1130 may lift up the stage 1100 to a predetermined or selectable height. In response to a stage control signal with a second voltage being received from the control unit 1800, the stage moving unit 1130 may lift down the stage 1100 to a predetermined or selectable height.

The supporting pins 1140 may support the mother substrate MSUB while the mother substrate MSUB is being put in or out of the apparatus 1000. The supporting pins 1140 may be connected to the pin supports 1150, which are disposed below the stage 1100, through the stage holes 1110 of the stage 1100.

In case that the stage 1100 is lowered by the stage moving unit 1130, the supporting pins 1140 may protrude from the top surface of the stage 1100. In case that the stage 1100 is raised by the stage moving unit 1130, the supporting pins 1140 may be inserted in the stage holes 1110 and thus may not protrude from the top surface of the stage 1100. Accordingly, in case that the stage 1100 is raised by the stage moving unit 1130, the mother substrate MSUB may be mounted on the top surface of the stage 1100.

The voltage output unit 1200 may generate alignment signals based on a control signal CS from the control unit

1800 and may provide the alignment signals to the amplifier 1300. The alignment signals may include first and second alignment signals AS1 and AS2. Referring to FIG. 9 and further to FIG. 7, the first alignment signal AS1 may be applied to first alignment lines AL1 of each of the panel cells CEL through the first alignment pads AP1, and the second alignment signal AS2 may be applied to the second alignment lines AL2 of each of the panel cells CEL through the second alignment pads AP2. For example, the first and second alignment signals AS1 and AS2 may be alternating current (AC) signals or direct current (DC) signals.

The voltage output unit 1200 may include a function generator. The voltage output unit 1200 may output at least one of a rectangular wave, a sine wave, a triangular wave, a pulse wave, a semi-sawtooth wave, a sawtooth wave, a sawtooth composite wave, and a reverse sawtooth composite wave that have a predetermined or selectable frequency. For example, the sawtooth composite wave may include sawtooth waves having different frequencies or amplitudes. The reverse sawtooth composite wave may include reverse sawtooth waves having different frequencies or amplitudes. The voltage output unit 1200 may determine the type, amplitude, and frequency of an output waveform based on the control signal CS.

The amplifier 1300 may receive the first and second alignment signals AS1 and AS2 from the voltage output unit 1200. The amplifier 1300 may amplify at least one of the first and second alignment signals AS1 and AS2 and supply it to the switching unit 1400. Accordingly, the amplitude of first and second alignment signals AS1 and AS2 output from the amplifier 1300 may be greater than the amplitude of first and second alignment signals AS1 and AS2 output from the voltage output unit 1200. For example, in case that the second alignment signal AS2 is a ground voltage or a DC voltage close to the ground voltage, the amplification 1300 may not amplify the second alignment signal AS2.

The switching unit 1400 may be connected to the amplifier 1300. The switching unit 1400 may include at least one switch and/or at least one multiplexer. The switching unit 1400 may receive the first and second alignment signals AS1 and AS2 from the amplifier 1300 during the alignment of light-emitting elements ED. The switching unit 1400 may receive the first and second alignment signals AS1 and AS2 and provide the first and second alignment signals AS1 and AS2 to the field application unit 1500. For example, the switching unit 1400 may provide the first and second alignment signals AS1 and AS2 collectively to all the field application unit 1500. In another example, the switching unit 1400 may provide the first and second alignment signals AS1 and AS2 selectively to some of the field application unit 1500.

The field application unit 1500 may be disposed on both sides of the stage 1100. The field application unit 1500 may be disposed on a first side of the stage 1100 to provide alignment signals to the first panel cell CEL1. The field application unit 1500 may be disposed on a second side of the stage 1100 to provide alignment signals to the second panel cell CEL2. The field application unit 1500 may include a probe head HBD, probe pins PP, a body portion BD, and a coupling portion CM.

The probe pins PP may be disposed below the probe head HBD. The probe pins PP may include a conductive material such as, for example, a metallic material. The number of probe pins PP may correspond to the number of first alignment pads AP1, second alignment pads AP2, third alignment pads AP3, and fourth alignment pads AP4. The probe pins PP may be connected to the first alignment pads AP1 and the second alignment pads AP2 or to the third alignment pads AP3 and the fourth alignment pads AP4 during the alignment of light-emitting elements ED.

The body portion BD may extend in the second direction (or the Y-axis direction). The body portion BD may be disposed between the probe head HBD and the coupling portion CM. An end of the body portion BD may be supported by the coupling portion CM, and another end of the body portion BD may support the probe head HBD. The body portion BD may be lifted up or down, together with the coupling portion CM, by one of the probe moving units 1510 and may provide alignment signals to the probe head HBD. For example, the body portion BD and the probe head HBD may be formed in one body with each other. In another example, the body portion BD and the probe head HBD may be provided as separate elements.

The coupling portion CM may extend in the third direction (or the Z-axis direction). The coupling portion may be disposed below the body portion BD. The coupling portion CM may extend in the third direction (or the Z-axis direction) from an end of the body portion BD. The coupling portion CM may be disposed between the body portion BD and one of the probe moving units 1510. The coupling portion CM may be lifted up or down by one of the probe moving units 1510.

The probe moving units 1510 may be connected to the sides of the stage 1100. The probe moving units 1510 may lift up or down the field application unit 1500 based on a module moving signal from the control unit 1800. The probe moving units 1510 may include motors as power sources for moving the field application unit 1500.

In response to a module moving signal with the first voltage being received from the control unit 1800, the probe moving units 1510 may lift up the field application unit 1500 to a predetermined or selectable height. In response to a module moving signal with the second voltage being received from the control unit 1800, the probe moving units 1510 may lift down the field application unit 1500 to a predetermined or selectable height.

In case that the probe moving units 1510 are lowered, the probe pins PP of each of the field application unit 1500 may be placed in contact with the first alignment pads AP1 and the second alignment pads AP2 of the mother substrate MSUB, which are connected to the first panel cell CEL1. The first and second alignment signals AS1 and AS2 may be applied to the first panel cell CEL1 on the mother substrate MSUB via the probe pins PP. As a result, multiple light-emitting elements ED may be aligned in each of the pixels SP of the first panel cell CEL1. In case that the probe moving units 1510 are raised, the probe pins PP may be detached apart from the first alignment pads AP1 and the second alignment pads AP2 of the mother substrate MSUB.

The emission driver 1600 may receive an emission timing signal LTS from the control unit 1800 and may provide an emission driving signal LDS to the light irradiation unit 1700. The light irradiation unit 1700 may include LEDs and may output light with a predetermined or selectable duty ratio based on the emission driving signal LDS. Thus, the control unit 1800 may control the light irradiation timing of the light irradiation unit 1700 by controlling the timing of applying the emission driving signal LDS.

The light irradiation unit 1700 may be disposed above the stage 1100 and may include LEDs. The light irradiation unit 1700 may irradiate light onto each of the panel cells CEL on the stage 1100. The light irradiation unit 1700 may cover the entire top surface of the stage 1100 or the entire top surface of the mother substrate MSUB. For example, the area of the light irradiation unit 1700 may be greater than the area of the stage 1100 or the area of the mother substrate MSUB. In another example, the length, in the first direction (or the X-axis direction), of the light irradiation unit 1700 may be greater than the length, in the first direction (or the X-axis direction), of the stage 1100, and the length, in the second direction (or the Y-axis direction), of the light irradiation unit 1700 may be greater than the length, in the second direction (or the Y-axis direction), of the stage 1100. The length, in the first direction (or the X-axis direction), of the light irradiation unit 1700 may be greater than the length, in the first direction (or the X-axis direction), of the mother substrate MSUB, and the length, in the second direction (or the Y-axis direction), of the light irradiation unit 1700 may be greater than the length, in the second direction (or the Y-axis direction), of the mother substrate MSUB.

For example, the light irradiation unit 1700 may apply light onto the first and second panel cells CEL1 and CEL2 of the mother substrate MSUB. In this example, the field application unit 1500 may provide alignment signals collectively to both the first and second panel cells CEL1 and CEL2. In another example, the light irradiation unit 1700 may selectively apply light to one of the first and second panel cells CEL1 and CEL2. In this example, the field application unit 1500 may selectively apply alignment signals to one of the first and second panel cells CEL1 and CEL2.

Each light-emitting element ED may include a p-type first semiconductor layer, an n-type second semiconductor layer, and an active layer. The active layer may be excited by light from the light irradiation unit 1700. Holes in the p-type first semiconductor layer may move toward the n-type second semiconductor layer, and electrons in the n-type second semiconductor layer may move toward the p-type first semiconductor layer. A strong permanent dipole moment may be generated in a direction from the p-type first semiconductor layer to the n-type second semiconductor layer. Thus, each light-emitting element ED may be defined as a particle having a polarity in its longitudinal direction in case excited by light from the light irradiation unit 1700.

The control unit 1800 may control operations of all the elements of the apparatus 1000. The control unit 1800 may control the moving up or down of the stage 1100 by providing a stage control signal to the stage moving unit 1130. The control unit 1800 may determine the waveform of the first and second alignment signals AS1 and AS2 by providing the control signal CS to the voltage output unit 1200. The waveform of the first and second alignment signals AS1 and AS2 may be determined by the type, amplitude, and frequency of the first and second alignment signals AS1 and AS2. The control unit 1800 may control the moving up or down of the field application unit 1500 by providing the module moving signal to the probe moving units 1510. The control unit 1800 may control the driving timing of the light irradiation unit 1700 by providing the emission timing signal LTS to the emission driver 1600. The control unit 1800 may synchronize the control signal and the emission timing signal LTS. For example, the first alignment signal AS1 and the emission timing signal LTS may be controlled to have the same frequency and to have a predetermined or selectable phase difference therebetween.

Figure 10:
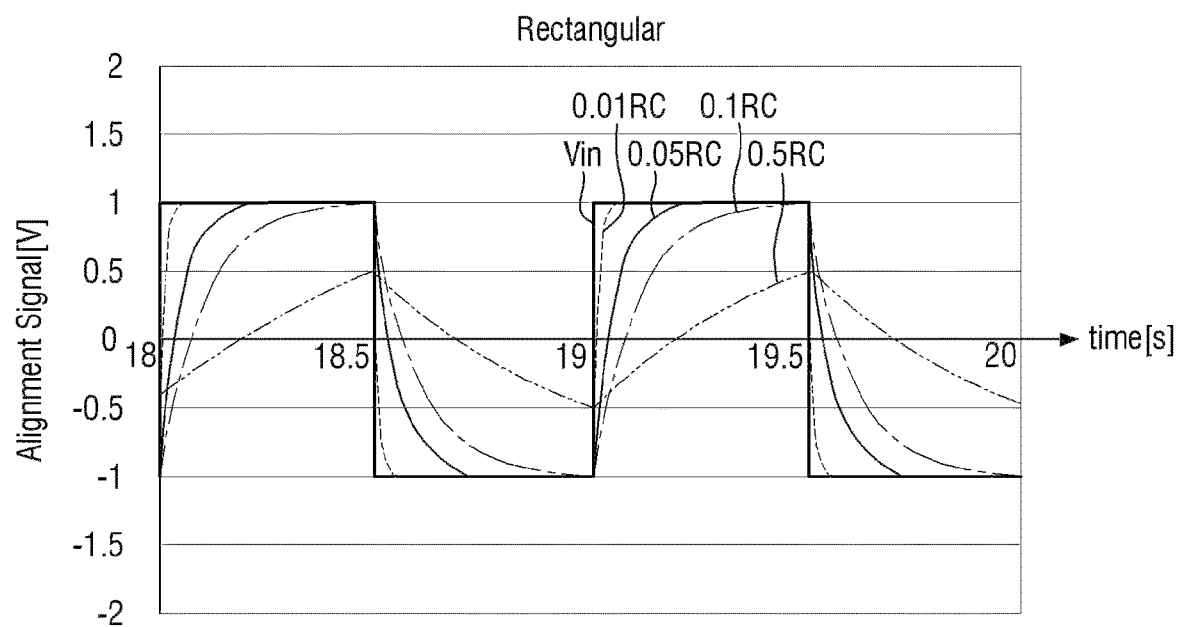
FIG. 10 is a schematic waveform diagram showing rectangular-wave alignment signals for use in the manufacture of a display device according to an embodiment of the disclosure.
Figure 11:
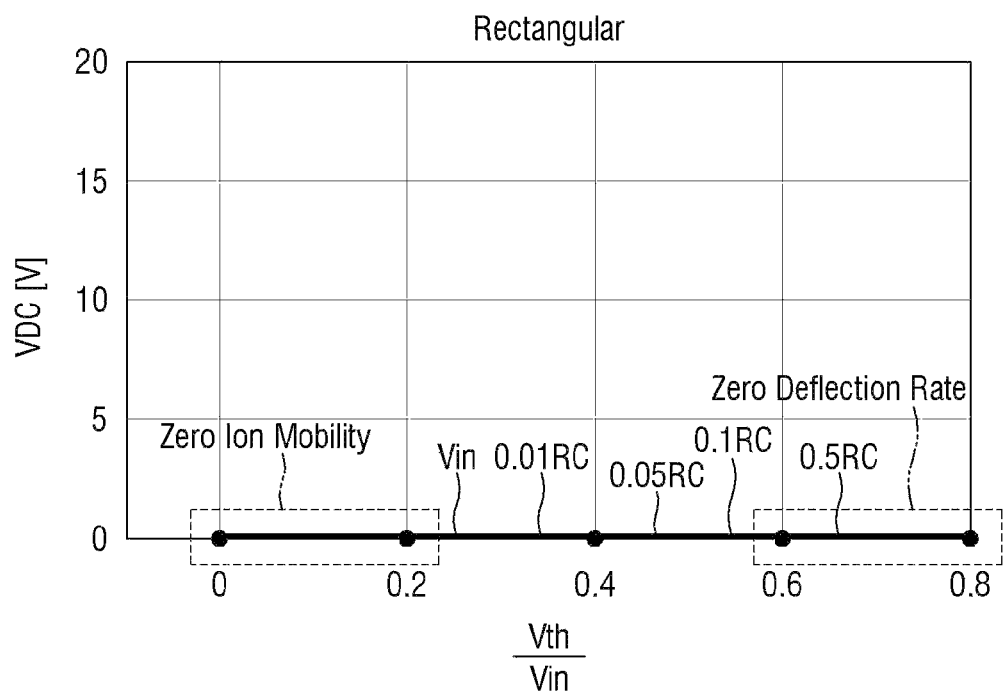
FIG. 11 is a schematic graph showing net DC voltages for different RC values according to the embodiment of FIG. 10.

FIG. 10 is a schematic waveform diagram showing rectangular-wave alignment signals for use in the manufacture of a display device according to an embodiment of the disclosure, FIG. 11 is a schematic graph showing net DC voltages for different RC values according to the embodiment of FIG. 10. Rectangular waves of FIG. 10 may correspond to the difference in electric potential between the first and second alignment signals AS1 and AS2.

Referring to FIGS. 10 and 11, the field application unit 1500 may provide the first alignment signal AS1 to the first alignment pads AP1 and the second alignment signal AP2 to the second alignment pads AP2. The difference in electric potential between the first and second alignment signals AS1 and AS2 may correspond to an input voltage Vin. The input voltage Vin may be a rectangular wave having a predetermined or selectable frequency. For example, the input voltage Vin may have one cycle from 18 sec to 19 sec and another cycle from 19 sec to 20 sec. The input voltage Vin may have a positive peak of 1 V and a negative peak level of −1 V. As the positive and negative integral values of the input voltage Vin may be substantially the same, the initial DC component of the input voltage Vin may be zero.

The input voltage Vin may cause an RC delay depending on an RC value determined by the electrical properties of each panel cell CEL. In case that each panel cell CEL has an RC value of 0.01, a 0.01-RC rectangular wave may be more delayed than the input voltage Vin. In case that each panel cell CEL has an RC value of 0.05, a 0.05-RC rectangular wave may be more delayed than the 0.01-RC rectangular wave. In case that each panel cell CEL has an RC value of 0.1, a 0.1-RC rectangular wave may be more delayed than the 0.05-RC rectangular wave. In case that each panel cell CEL has an RC value of 0.5, a 0.5-RC rectangular wave may be more delayed than the 0.1-RC rectangular wave. The 0.01-RC, 0.05-RC, and 0.1-RC rectangular waves may have a positive peak voltage of 1 V and a negative peak voltage of −1 V. The 0.5-RC rectangular wave may have a positive peak voltage of 0.5 V and a negative peak voltage of −0.5 V. As the positive and negative integral values of each of the 0.01-RC, 0.05-RC, 0.1-RC, and 0.5-RC rectangular waves may be substantially the same, the initial DC component of each of the 0.01-RC, 0.05-RC, 0.1-RC, and 0.5-RC rectangular waves may be zero.

A net DC voltage VDC may be derived by offsetting positive and negative integral values exceeding a threshold voltage Vth. Here, the threshold voltage Vth may be determined by a force pulling each light-emitting element ED, such as a force by induced dipoles. Referring to FIGS. 10 and 11, in case that the threshold voltage Vth is less than the input voltage Vin, the net DC voltage (VDC) of the rectangular waves of FIG. 10 may be close to zero, and no ion mobility may occur ("Zero Ion Mobility"). Even In case that the threshold voltage Vth increases, the net DC voltage (VDC) of the rectangular waves of FIG. 10 may still be close to zero, and the deflection rate of the rectangular waves of FIG. 10 may be as low as zero ("Zero Deflection Rate"). Here, the net DC voltage (VDC) of the rectangular wave of FIG. 10 may correspond to an effective voltage for deflecting each light-emitting element ED.

Figure 12:
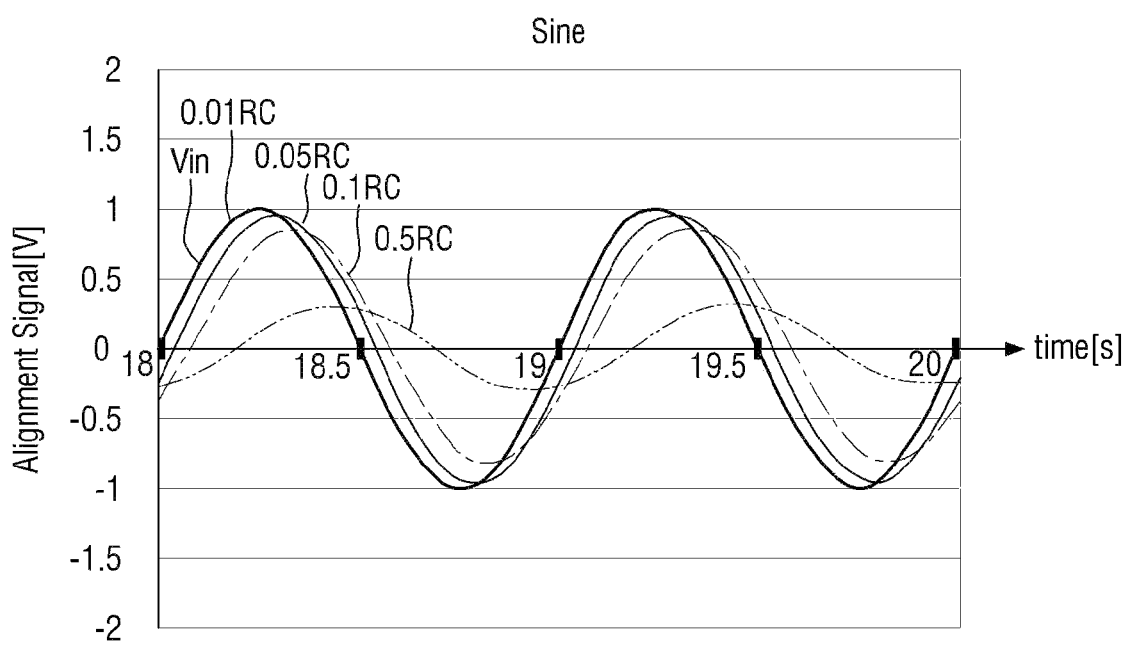
FIG. 12 is a schematic waveform diagram showing sine-wave alignment signals during the manufacture of a display device according to an embodiment of the disclosure.
Figure 13:
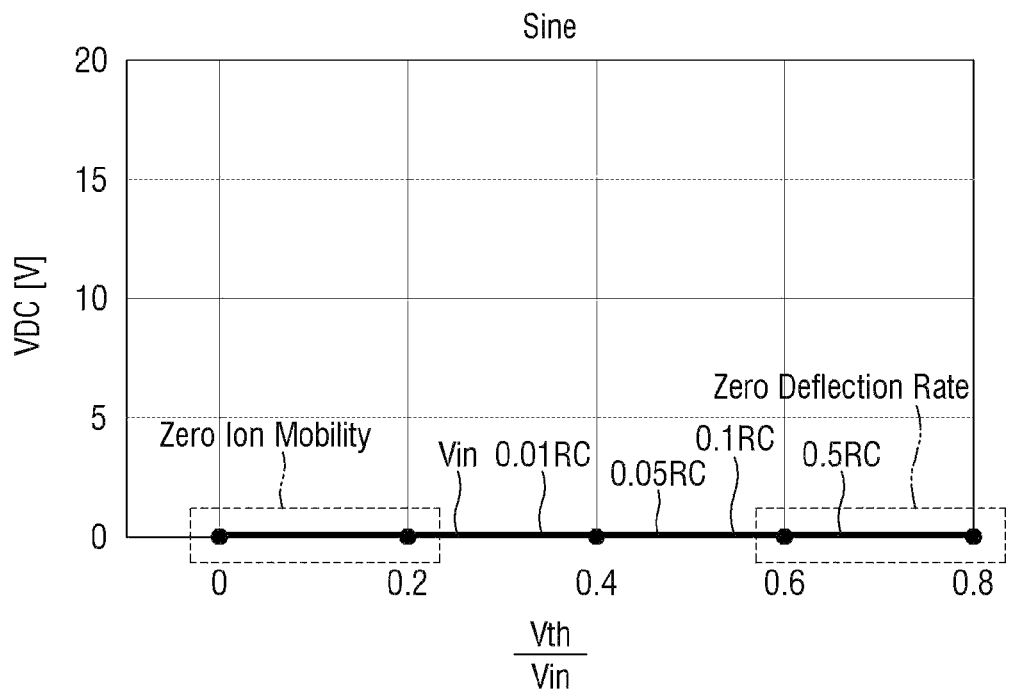
FIG. 13 is a schematic graph showing net DC voltages for different RC values according to the embodiment of FIG. 12.

FIG. 12 is a schematic waveform diagram showing sine-wave alignment signals for use in the manufacture of a display device according to an embodiment of the disclosure, FIG. 13 is a schematic graph showing net DC voltages for different RC values according to the embodiment of FIG. 12. Sine waves of FIG. 12 may correspond to the difference in electric potential between the first and second alignment signals AS1 and AS2.

Referring to FIGS. 12 and 13, the field application unit 1500 may provide the first alignment signal AS1 to the first alignment pads AP1 and the second alignment signal AP2 to the second alignment pads AP2. The difference in electric potential between the first and second alignment signals AS1 and AS2 may correspond to an input voltage Vin. The input voltage Vin may be a sine wave having a predetermined or selectable frequency. For example, the input voltage Vin may have one cycle from 18 sec to 19 sec and another cycle from 19 sec to 20 sec. The input voltage Vin may have a positive peak of 1 V and a negative peak level of −1 V. As the positive and negative integral values of the input voltage Vin may be substantially the same, the initial DC component of the input voltage Vin may be zero.

The input voltage Vin may cause an RC delay depending on an RC value determined by the electrical properties of each panel cell CEL. In case that each panel cell CEL has an RC value of 0.01, a 0.01-RC sine wave may be similar to the input voltage Vin. In case that each panel cell CEL has an RC value of 0.05, a 0.05-RC sine wave may be more delayed than the 0.01-RC sine wave. In case that each panel cell CEL has an RC value of 0.1, a 0.1-RC sine wave may be more delayed than the 0.05-RC sine wave. In case that each panel cell CEL has an RC value of 0.5, a 0.5-RC sine wave may be more delayed than the 0.1-RC sine wave. The 0.05-RC sine wave may have a lower positive peak voltage than the 0.01-RC sine wave, and the 0.1-RC sine wave may have a lower positive peak voltage than the 0.05-RC sine wave, and the 0.5-RC sine wave may have a lower positive peak voltage than the 0.1-RC sine wave. As the positive and negative integral values of each of the 0.01-RC, 0.05-RC, 0.1-RC, and 0.5-RC sine waves may be substantially the same, the initial DC component of each of the 0.01-RC, 0.05-RC, 0.1-RC, and 0.5-RC sine waves may be zero.

A net DC voltage VDC may be derived by offsetting positive and negative integral values exceeding a threshold voltage Vth. Referring to FIGS. 12 and 13, in case that the threshold voltage Vth is lower than the input voltage Vin, the net DC voltage (VDC) of the sine waves of FIG. 12 may be close to zero, and no ion mobility may occur ("Zero Ion Mobility"). Even if the threshold voltage Vth increases, the net DC voltage (VDC) of the sine waves of FIG. 12 may still be close to zero, and the deflection rate of the sine waves of FIG. 12 may be as low as zero ("Zero Deflection Rate").

Figure 14:
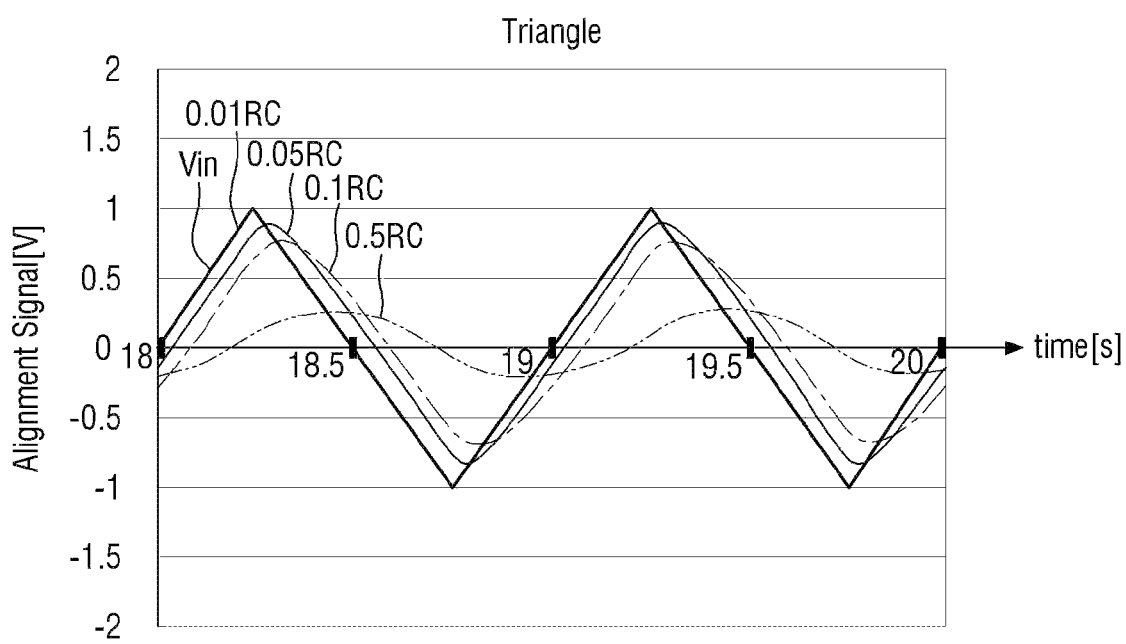
FIG. 14 is a schematic waveform diagram showing triangular-wave alignment signals during the manufacture of a display device according to an embodiment of the disclosure.
Figure 15:
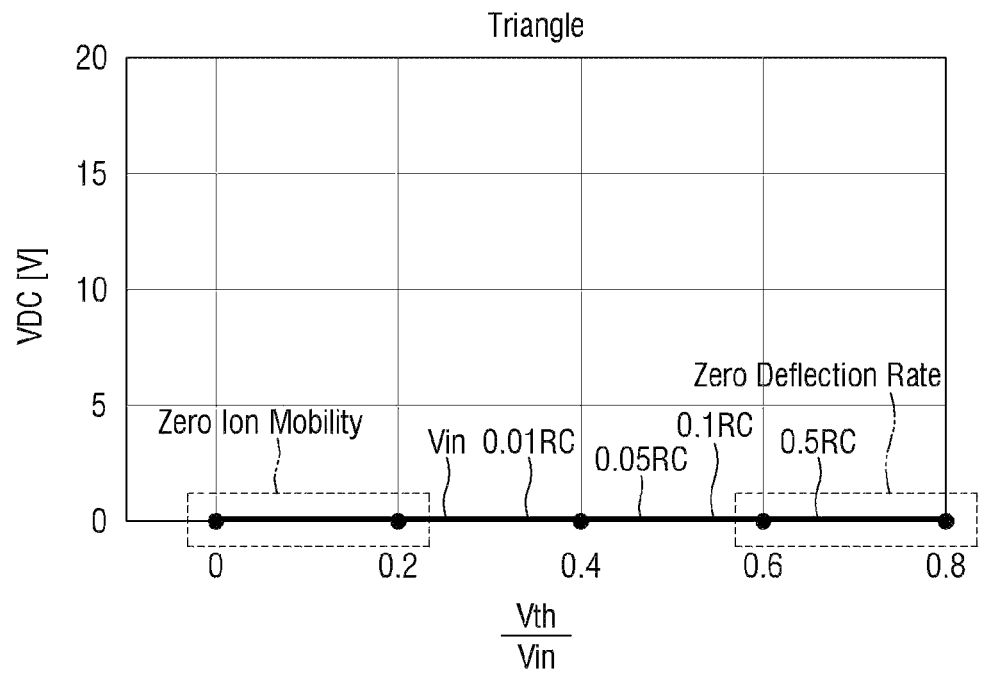
FIG. 15 is a schematic graph showing net DC voltages for different RC values according to the embodiment of FIG. 14.

FIG. 14 is a schematic waveform diagram showing triangular-wave alignment signals for use in the manufacture of a display device according to an embodiment of the disclosure, FIG. 15 is a schematic graph showing net DC voltages for different RC values according to the embodiment of FIG. 14. Triangular waves of FIG. 14 may correspond to the difference in electric potential between the first and second alignment signals AS1 and AS2.

Referring to FIGS. 14 and 15, the field application unit 1500 may provide the first alignment signal AS1 to the first alignment pads AP1 and the second alignment signal AP2 to the second alignment pads AP2. The difference in electric potential between the first and second alignment signals AS1 and AS2 may correspond to an input voltage Vin. The input voltage Vin may be a triangular wave having a predetermined or selectable frequency. For example, the input voltage Vin may have one cycle from 18 sec to 19 sec and another cycle from 19 sec to 20 sec. The input voltage Vin may have a positive peak of 1 V and a negative peak level of −1 V. As the positive and negative integral values of the input voltage Vin may be substantially the same, the initial DC component of the input voltage Vin may be zero.

The input voltage Vin may cause an RC delay depending on an RC value determined by the electrical properties of each panel cell CEL. In case that each panel cell CEL has an RC value of 0.01, a 0.01-RC triangular wave may be similar to the input voltage Vin. In case that each panel cell CEL has an RC value of 0.05, a 0.05-RC triangular wave may be more delayed than the 0.01-RC triangular wave. In case that each panel cell CEL has an RC value of 0.1, a 0.1-RC triangular wave may be more delayed than the 0.05-RC triangular wave. In case that each panel cell CEL has an RC value of 0.5, a 0.5-RC triangular wave may be more delayed than the 0.1-RC triangular wave. The 0.05-RC triangular wave may have a lower positive peak voltage than the 0.01-RC triangular wave, and the 0.1-RC triangular wave may have a lower positive peak voltage than the 0.05-RC triangular wave, and the 0.5-RC triangular wave may have a lower positive peak voltage than the 0.1-RC triangular wave. As the positive and negative integral values of each of the 0.01-RC, 0.05-RC, 0.1-RC, and 0.5-RC triangular waves may be substantially the same, the initial DC component of each of the 0.01-RC, 0.05-RC, 0.1-RC, and 0.5-RC triangular waves may be zero.

A net DC voltage VDC may be derived by offsetting positive and negative integral values exceeding a threshold voltage Vth. Referring to FIGS. 14 and 15, in case that the threshold voltage Vth is lower than the input voltage Vin, the net DC voltage (VDC) of the triangular waves of FIG. 14 may be close to zero, and no ion mobility may occur ("Zero Ion Mobility"). Even if the threshold voltage Vth increases, the net DC voltage (VDC) of the triangular waves of FIG. 14 may still be close to zero, and the deflection rate of the triangular waves of FIG. 14 may be as low as zero ("Zero Deflection Rate").

Figure 16:
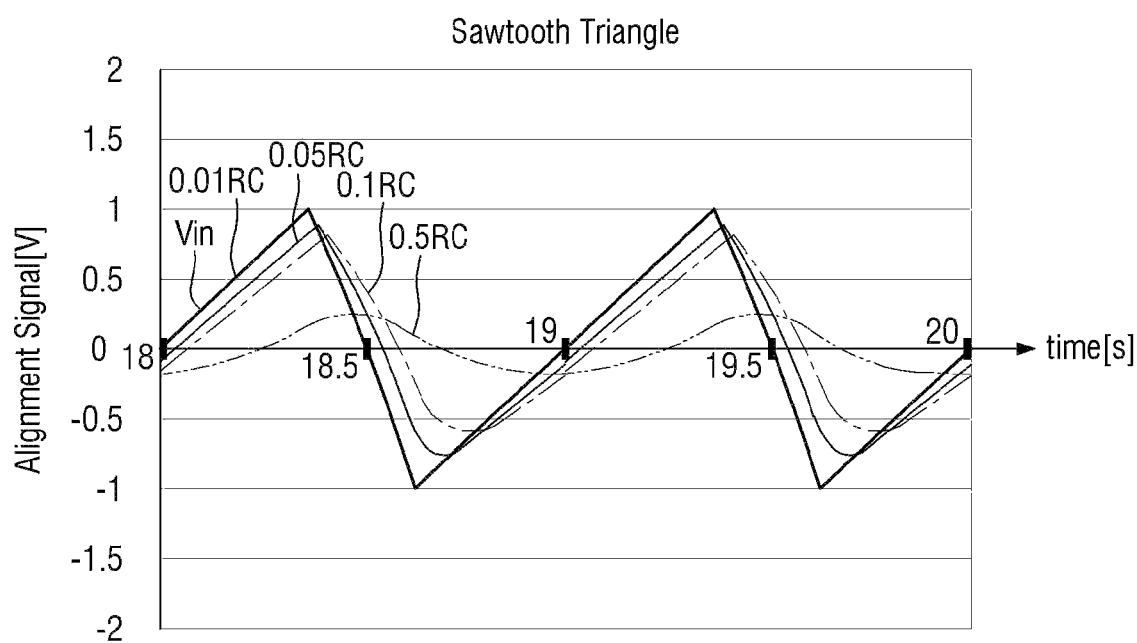
FIG. 16 is a schematic waveform diagram showing semi-sawtooth-wave alignment signals during the manufacture of a display device according to an embodiment of the disclosure.
Figure 17:
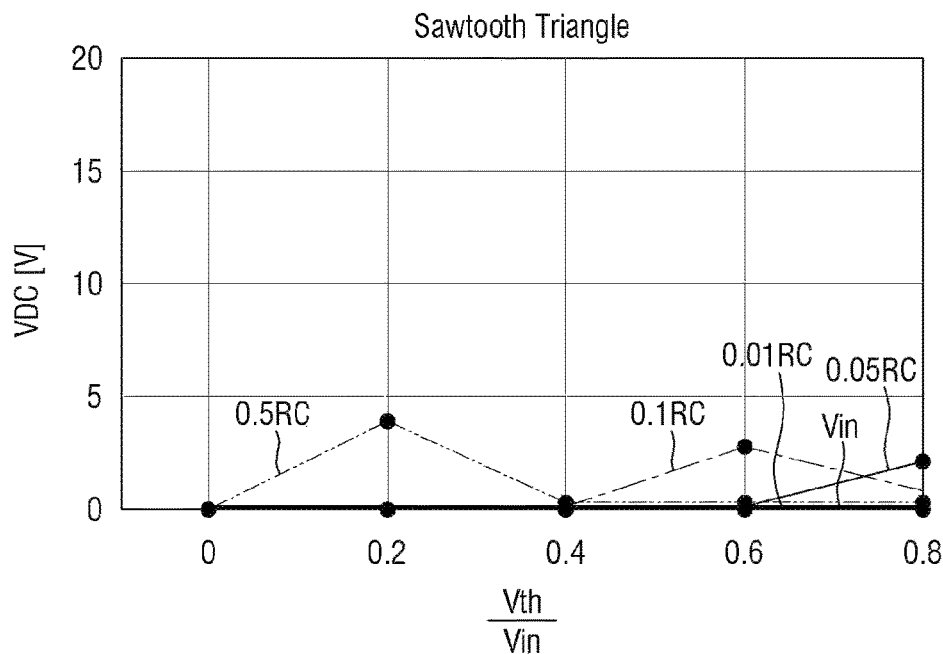
FIG. 17 is a schematic graph showing net DC voltages for different RC values according to the embodiment of FIG. 16.

FIG. 16 is a schematic waveform diagram showing semi-sawtooth-wave alignment signals for use in the manufacture of a display device according to an embodiment of the disclosure, and FIG. 17 is a schematic graph showing net DC voltages for different RC values according to the embodiment of FIG. 16. Semi-sawtooth waves of FIG. 16 may correspond to the difference in electric potential between the first and second alignment signals AS1 and AS2 and may be an intermediate waveform between triangular waves and sawtooth waves.

Referring to FIGS. 16 and 17, the field application unit 1500 may provide the first alignment signal AS1 to the first alignment pads AP1 and the second alignment signal AP2 to the second alignment pads AP2. The difference in electric potential between the first and second alignment signals AS1 and AS2 may correspond to an input voltage Vin. The input voltage Vin may be a semi-sawtooth wave having a predetermined or selectable frequency. For example, the input voltage Vin may have one cycle from 18 sec to 19 sec and another cycle from 19 sec to 20 sec. The input voltage Vin may have a positive peak of 1 V and a negative peak level of −1 V. As the positive and negative integral values of the input voltage Vin may be substantially the same, the initial DC component of the input voltage Vin may be zero.

The input voltage Vin may cause an RC delay depending on an RC value determined by the electrical properties of each panel cell CEL. In case that each panel cell CEL has an RC value of 0.01, a 0.01-RC semi-sawtooth wave may be similar to the input voltage Vin. In case that each panel cell CEL has an RC value of 0.05, a 0.05-RC semi-sawtooth wave may be more delayed than the 0.01-RC semi-sawtooth wave. In case that each panel cell CEL has an RC value of 0.1, a 0.1-RC semi-sawtooth wave may be more delayed than the 0.05-RC semi-sawtooth wave. In case that each panel cell CEL has an RC value of 0.5, a 0.5-RC semi-sawtooth wave may be more delayed than the 0.1-RC semi-sawtooth wave. The 0.05-RC semi-sawtooth wave may have a lower positive peak voltage than the 0.01-RC semi-sawtooth wave, and the 0.1-RC semi-sawtooth wave may have a lower positive peak voltage than the 0.05-RC semi-sawtooth wave, and the 0.5-RC semi-sawtooth wave may have a lower positive peak voltage than the 0.1-RC semi-sawtooth wave.

As the positive and negative integral values of the 0.01-RC semi-sawtooth wave may be substantially the same, the initial DC component of the 0.01-RC semi-sawtooth wave may be zero. Thus, in case that the threshold voltage Vth is lower than the input voltage Vin, the net DC voltage (VDC) of the 0.01-RC semi-sawtooth wave may be close to zero, and no ion mobility may occur ("Zero Ion Mobility"). Even if the threshold voltage Vth increases, the net DC voltage (VDC) of the 0.01-RC semi-sawtooth wave may still be close to zero, and the deflection rate of the 0.01-RC semi-sawtooth wave may be as low as zero.

The positive integral value of the 0.05-RC semi-sawtooth wave may be slightly greater than the negative integral value of the 0.05-RC semi-sawtooth wave. Thus, in case that the threshold voltage Vth is lower than the input voltage Vin, the net DC voltage (VDC) of the 0.05-RC semi-sawtooth wave may be close to zero, and no ion mobility may occur. In case that the threshold voltage Vth increases, the net DC voltage (VDC) of the 0.05-RC semi-sawtooth wave may slightly increase so that the deflection rate of the 0.05-RC semi-sawtooth wave may be slightly improved. For example, in case that the ratio of the threshold voltage Vth to the input voltage Vin, i.e., Vth/Vin, is 0.8, the net DC voltage (VDC) of the 0.05-RC semi-sawtooth wave may reach its maximum.

The positive integral value of the 0.1-RC semi-sawtooth wave may be greater than the negative integral value of the 0.1-RC semi-sawtooth wave. Thus, in case that the threshold voltage Vth is lower than the input voltage Vin, the net DC voltage (VDC) of the 0.1-RC semi-sawtooth wave may be close to zero, and no ion mobility may occur. In case that the threshold voltage Vth increases, the net DC voltage (VDC) of the 0.1-RC semi-sawtooth wave may slightly increase so that the deflection rate of the 0.1-RC semi-sawtooth wave may be slightly improved. For example, in case that the ratio of the threshold voltage Vth to the input voltage Vin, i.e., Vth/Vin, is 0.6, the net DC voltage (VDC) of the 0.1-RC semi-sawtooth wave may reach its maximum.

The positive integral value of the 0.5-RC semi-sawtooth wave may be greater than the negative integral value of the 0.5-RC semi-sawtooth wave. Thus, in case that the threshold voltage Vth is lower than the input voltage Vin, the net DC voltage (VDC) of the 0.5-RC semi-sawtooth wave may be greater than zero, and ion mobility may occur. For example, in case that the ratio of the threshold voltage Vth to the input voltage Vin, i.e., Vth/Vin, is 0.2, the net DC voltage (VDC) of the 0.5-RC semi-sawtooth wave may reach its maximum. In case that the threshold voltage Vth increases, the net DC voltage (VDC) of the 0.5-RC semi-sawtooth wave may be close to zero so that the deflection rate of the 0.5-RC semi-sawtooth wave may be zero (or close to zero).

Figure 18:
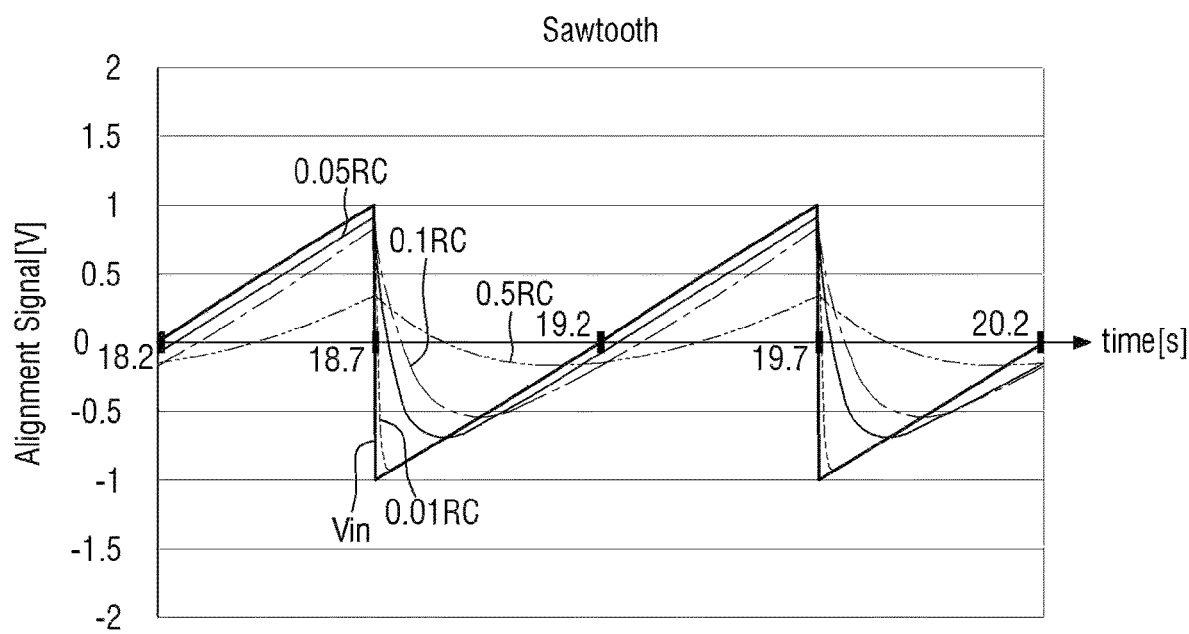
FIG. 18 is a schematic waveform diagram showing sawtooth-wave alignment signals during the manufacture of a display device according to an embodiment of the disclosure.
Figure 19:
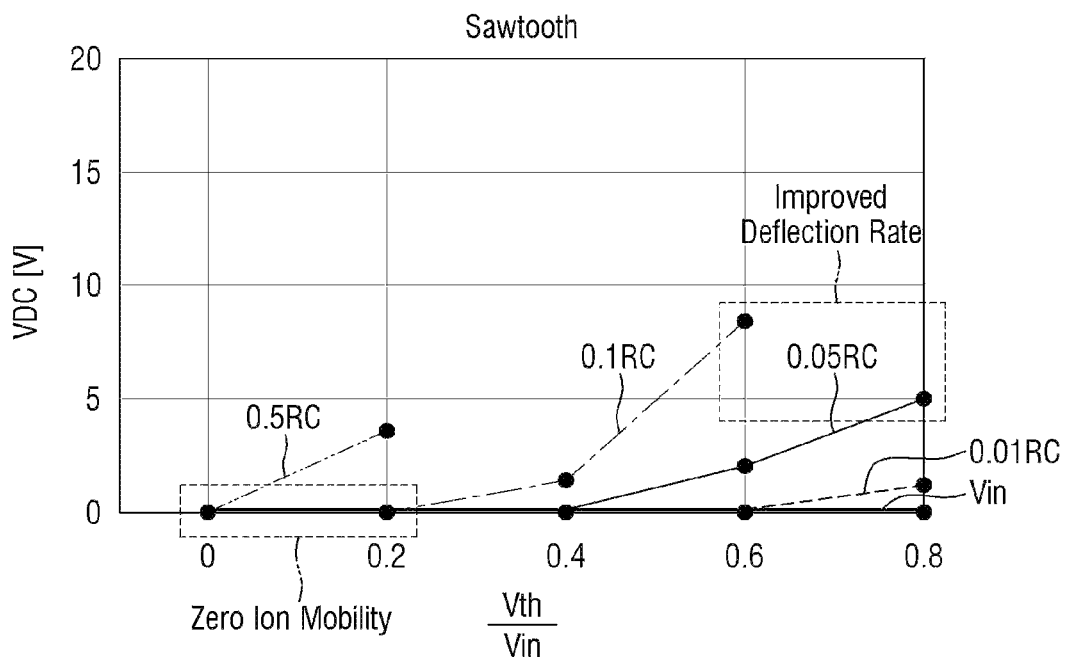
FIG. 19 is a schematic graph showing net DC voltages for different RC values according to the embodiment of FIG. 18.

FIG. 18 is a schematic waveform diagram showing sawtooth-wave alignment signals for use in the manufacture of a display device according to an embodiment of the disclosure, and FIG. 19 is a schematic graph showing net DC voltages for different RC values according to the embodiment of FIG. 18. Sawtooth waves of FIG. 18 may correspond to the difference in electric potential between the first and second alignment signals AS1 and AS2.

Referring to FIGS. 18 and 19, the field application unit 1500 may provide the first alignment signal AS1 to the first alignment pads AP1 and the second alignment signal AP2 to the second alignment pads AP2. The difference in electric potential between the first and second alignment signals AS1 and AS2 may correspond to an input voltage Vin. The input voltage Vin may be a sawtooth wave having a predetermined or selectable frequency. For example, the input voltage Vin may have one cycle from 18.2 sec to 19.2 sec and another cycle from 19.2 sec to 20.2 sec. The input voltage Vin may have a positive peak of 1 V and a negative peak level of −1 V. As the positive and negative integral values of the input voltage Vin may be substantially the same, the initial DC component of the input voltage Vin may be zero.

The input voltage Vin may cause an RC delay depending on an RC value determined by the electrical properties of each panel cell CEL. In case that each panel cell CEL has an RC value of 0.01, a 0.01-RC sawtooth wave may be more delayed than the input voltage Vin. In case that each panel cell CEL has an RC value of 0.05, a 0.05-RC sawtooth wave may be more delayed than the 0.01-RC sawtooth wave. In case that each panel cell CEL has an RC value of 0.1, a 0.1-RC sawtooth wave may be more delayed than the 0.05-RC sawtooth wave. In case that each panel cell CEL has an RC value of 0.5, a 0.5-RC sawtooth wave may be more delayed than the 0.1-RC sawtooth wave. The 0.1-RC sawtooth wave may have a similar positive peak voltage to the input voltage Vin, but may have a higher negative peak voltage than the input voltage Vin. The 0.05-RC sawtooth wave may have a higher negative peak voltage than the 0.01-RC sawtooth wave, the 0.1-RC sawtooth wave may have a higher positive peak voltage than the 0.05-RC sawtooth wave, and the 0.5-RC sawtooth wave may have a lower negative peak voltage than the 0.1-RC sawtooth wave.

The positive integral value of the 0.01-RC sawtooth wave may be slightly greater than the negative integral value of the 0.01-RC sawtooth wave. Thus, in case that a threshold voltage Vth is lower than the input voltage Vin, the net DC voltage (VDC) of the sawtooth waves of FIG. 16 may be close to zero, and no ion mobility may occur ("Zero Ion Mobility"). In case that the threshold voltage Vth increases, the net DC voltage (VDC) of the 0.01-RC sawtooth wave may slightly increase so that the deflection rate of the 0.01-RC sawtooth wave may be slightly improved. For example, in case that the ratio of the threshold voltage Vth to the input voltage Vin, i.e., Vth/Vin, is 0.8, the net DC voltage (VDC) of the 0.01-RC sawtooth wave may reach its maximum.

The positive integral value of the 0.05-RC sawtooth wave may be greater than the negative integral value of the 0.05-RC sawtooth wave. Thus, in case that the threshold voltage Vth is lower than the input voltage Vin, the net DC voltage (VDC) of the 0.05-RC sawtooth wave may be close to zero, and no ion mobility may occur ("Zero Ion Mobility"). In case that the threshold voltage Vth increases, the net DC voltage (VDC) of the 0.05-RC sawtooth wave may increase so that the deflection rate of the 0.05-RC sawtooth wave may be improved ("Improved Deflection Rate"). For example, in case that the ratio of the threshold voltage Vth to the input voltage Vin, i.e., Vth/Vin, is 0.8, the net DC voltage (VDC) of the 0.05-RC sawtooth wave may reach its maximum. The maximum net DC voltage of the 0.05-RC sawtooth wave may be higher than the maximum net DC voltage of the 0.01-RC sawtooth wave.

The positive integral value of the 0.1-RC sawtooth wave may be greater than the negative integral value of the 0.1-RC sawtooth wave. Thus, in case that the threshold voltage Vth is lower than the input voltage Vin, the net DC voltage (VDC) of the 0.1-RC sawtooth wave may be close to zero, and no ion mobility may occur ("Zero Ion Mobility"). In case that the threshold voltage Vth increases, the net DC voltage (VDC) of the 0.1-RC sawtooth wave may increase so that the deflection rate of the 0.1-RC sawtooth wave may be improved. For example, in case that the ratio of the threshold voltage Vth to the input voltage Vin, i.e., Vth/Vin, is 0.6, the net DC voltage (VDC) of the 0.1-RC sawtooth wave may reach its maximum. The maximum net DC voltage of the 0.1-RC sawtooth wave may be higher than the maximum net DC voltage of the 0.05-RC sawtooth wave.

The positive integral value of the 0.5-RC sawtooth wave may be greater than the negative integral value of the 0.5-RC sawtooth wave. Thus, in case that the threshold voltage Vth is lower than the input voltage Vin, the net DC voltage (VDC) of the 0.5-RC sawtooth wave may be greater than zero, and ion mobility may occur. For example, in case that the ratio of the threshold voltage Vth to the input voltage Vin, i.e., Vth/Vin, is 0.2, the net DC voltage (VDC) of the 0.5-RC sawtooth wave may reach its maximum.

Figure 20:
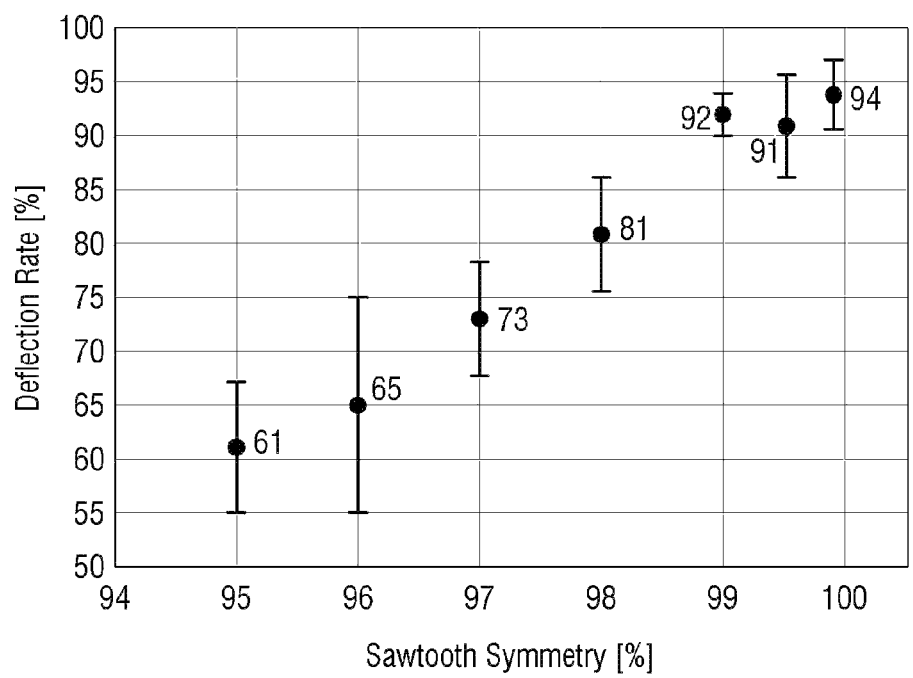
FIG. 20 is a schematic graph showing deflection rates for different sawtooth symmetries according to an embodiment of the disclosure.

FIG. 20 is a schematic graph showing deflection rates for different sawtooth symmetries according to an embodiment of the disclosure.

Referring to FIG. 20, alignment signals having a sawtooth symmetry close to 100% may correspond to the sawtooth waves of FIG. 18. Sawtooth waves having a sawtooth symmetry close to 100% may have a median deflection rate of 92%. Alignment signals having a relatively low sawtooth symmetry may correspond to the semi-sawtooth waves of FIG. 16. Sawtooth waves having a sawtooth symmetry close to 95% may have a median deflection rate of 61%. Thus, the deflection rate of the sawtooth waves of FIG. 18 may be more excellent than the deflection rate of the semi-sawtooth waves of FIG. 16.

Figure 21:
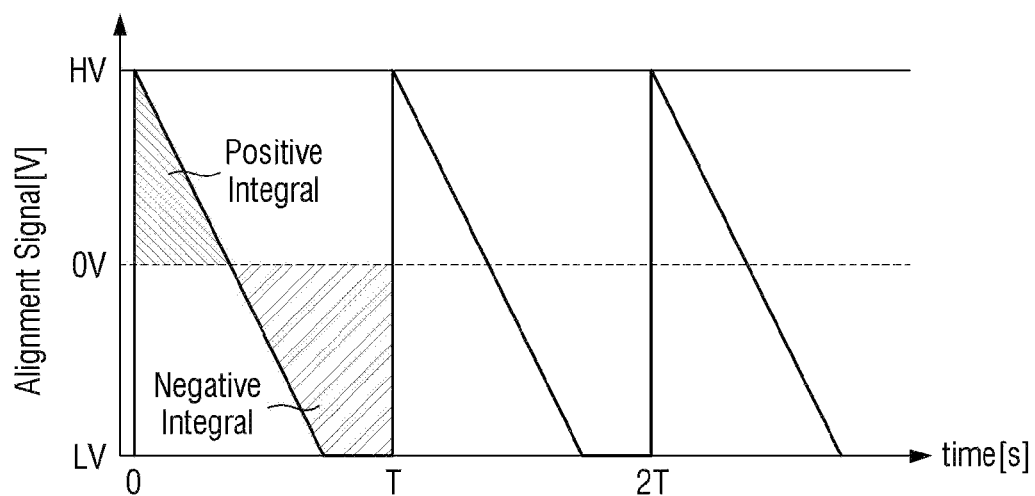
FIG. 21 is a schematic waveform diagram of an alignment signal having an initial DC component, according to an embodiment of the disclosure.

FIG. 21 is a schematic waveform diagram showing an alignment signal having an initial DC component, according to an embodiment of the disclosure. The alignment signal of FIG. 21 may correspond to the difference in electric potential between the first and second alignment signals AS1 and AS2.

Referring to FIG. 21, the alignment signal may have a predetermined or selectable frequency. The alignment signal may have a positive peak voltage HV and a negative peak voltage LV during one cycle T. The positive integral value of the alignment signal may be less than the negative integral value of the alignment signal. Thus, the alignment signal may have a negative initial DC component. Accordingly, in case that a threshold voltage Vth is relatively low, ion mobility may occur, and thus, the input efficiency of the alignment signal may be lowered.

Figure 22:
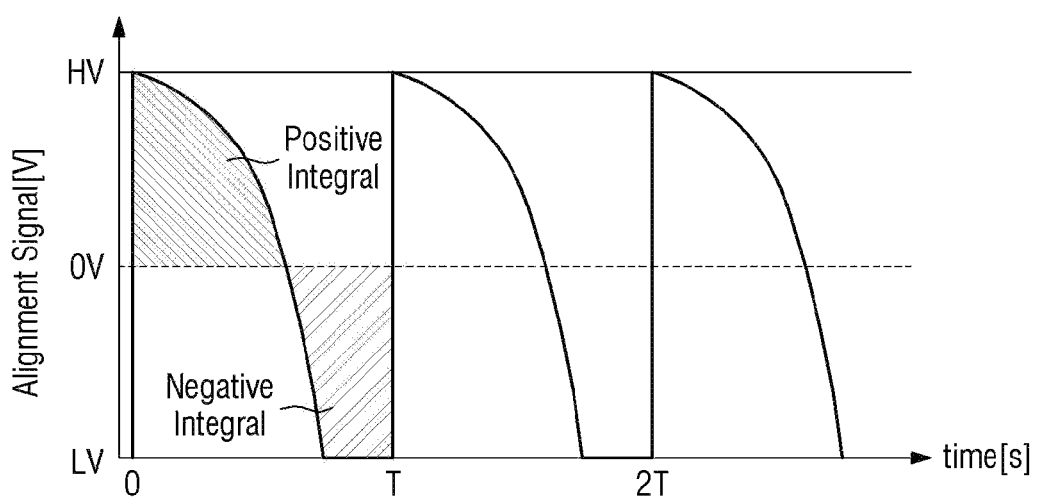
FIG. 22 is a waveform diagram of an alignment signal having an initial DC component, according to another embodiment of the disclosure.

FIG. 22 is a schematic waveform diagram of an alignment signal having an initial DC component, according to another embodiment of the disclosure. The alignment signal of FIG. 22 may correspond to the difference in electric potential between the first and second alignment signals AS1 and AS2.

Referring to FIG. 22, the alignment signal may have a positive peak voltage HV and a negative peak voltage LV during one cycle T. The positive integral value of the alignment signal may be greater than the negative integral value of the alignment signal. Thus, the alignment signal may have a positive initial DC component. Accordingly, in case that a threshold voltage Vth is relatively low, ion mobility may occur, and thus, the input efficiency of the alignment signal may be lowered.

Figure 23:
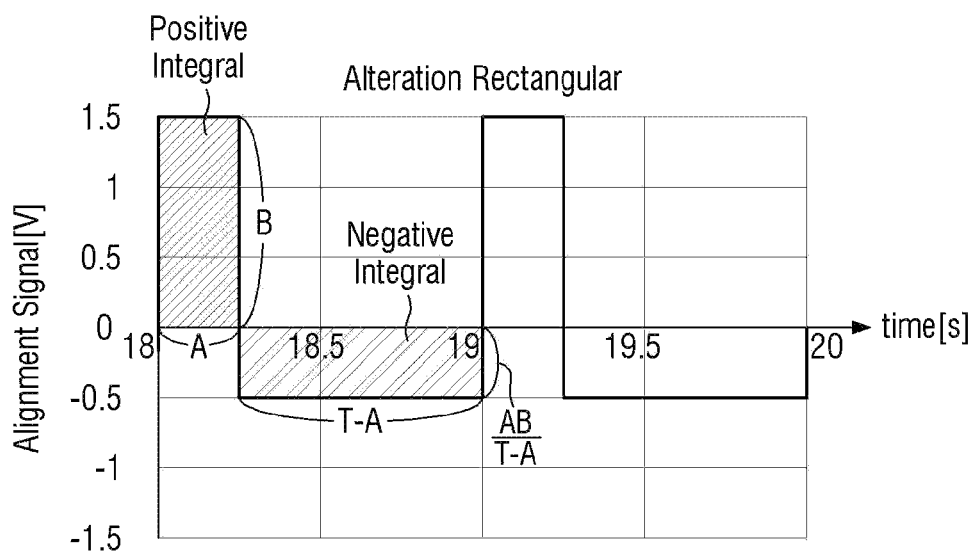
FIG. 23 is a schematic waveform diagram of an altered rectangular-wave alignment signal according to an embodiment of the disclosure.
Figure 24:
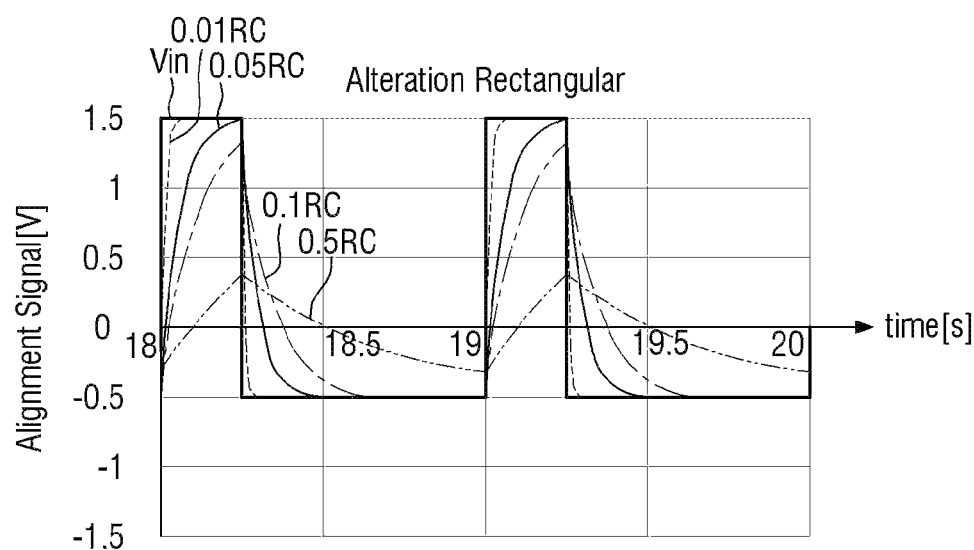
FIG. 24 is a schematic waveform diagram showing altered rectangular-wave alignment signals for different RC values.
Figure 25:
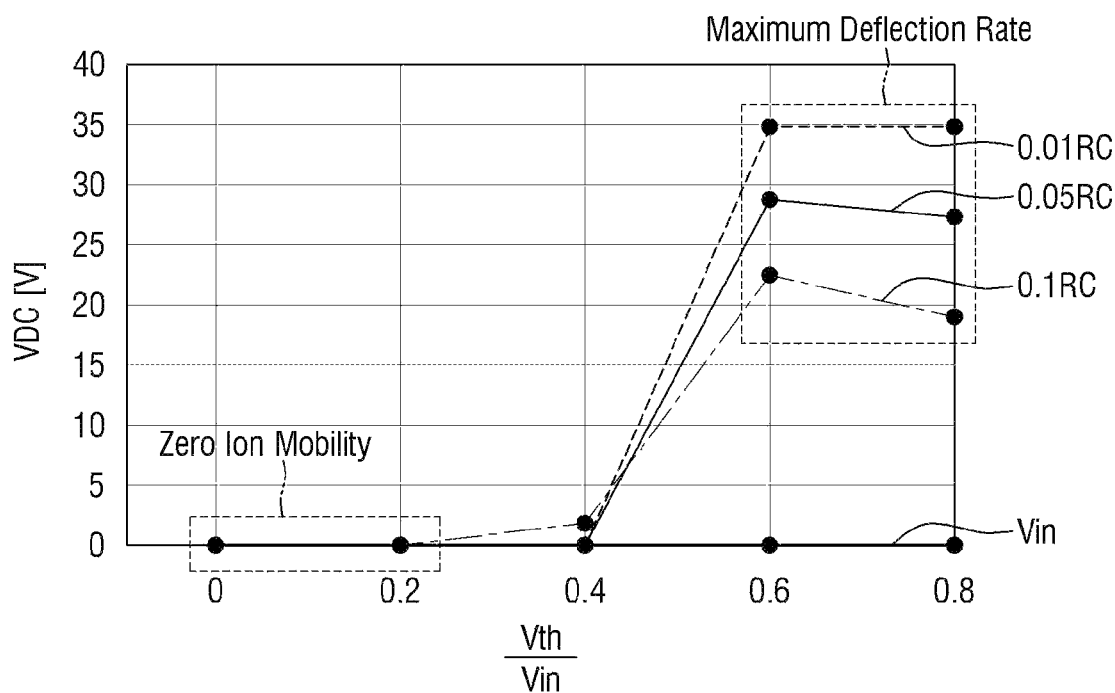
FIG. 25 is a schematic graph showing net DC voltages for different RC values according to the embodiment of FIG. 24.

FIG. 23 is a schematic waveform diagram of an altered rectangular-wave alignment signal according to an embodiment of the disclosure. FIG. 24 is a schematic waveform diagram showing altered rectangular-wave alignment signals for different RC values. FIG. 25 is a schematic graph showing net DC voltages for different RC values according to the embodiment of FIG. 24. Altered rectangular waves of FIGS. 23 and 24 may correspond to the difference in electric potential between the first and second alignment signals AS1 and AS2.

Referring to FIGS. 23 through 25, the field application unit 1500 may provide the first alignment signal AS1 to the first alignment pads AP1 and the second alignment signal AP2 to the second alignment pads AP2. The difference in electric potential between the first and second alignment signals AS1 and AS2 may correspond to an input voltage Vin. The input voltage Vin may be a sawtooth wave having a predetermined or selectable frequency. For example, the input voltage Vin may have one cycle (T) from 18 sec to 19 sec and another cycle (T) from 19 sec to 20 sec.

The positive peak voltage of the input voltage Vin may differ from the negative peak voltage of the input voltage Vin, and the positive pulse width of the input voltage Vin may differ from the negative pulse width of the input voltage Vin. The input voltage Vin may have a voltage (V) of B (where B is a positive real number) for as many seconds as A (where A is a positive real number) and a voltage (V) of as many seconds as −(A×B)/(T−A) for (T−A). Referring to FIG. 23, A=0.25, B=1.5, and T=1. However, the disclosure is not limited to this. The input voltage Vin may have a positive peak voltage of 1.5 V and a negative peak voltage of −0.5 V. The input voltage Vin may have a positive pulse width of 0.25 sec and a negative pulse width of 0.75 sec. The positive integral value (i.e., A×B) of the input voltage Vin may be substantially the same as the negative integral value (i.e., A×B) of the input voltage Vin, and the input DC component of the input voltage Vin may be zero.

The input voltage Vin may cause an RC delay depending on an RC value determined by the electrical properties of each panel cell CEL. In case that each panel cell CEL has an RC value of 0.01, a 0.01-RC altered rectangular wave may be more delayed than the input voltage Vin. In case that each panel cell CEL has an RC value of 0.05, a 0.05-RC altered rectangular wave may be more delayed than the 0.01-RC altered rectangular wave. In case that each panel cell CEL has an RC value of 0.1, a 0.1-RC altered rectangular wave may be more delayed than the 0.05-RC altered rectangular wave. In case that each panel cell CEL has an RC value of 0.5, a 0.5-RC altered rectangular wave may be more delayed than the 0.1-RC altered rectangular wave. The 0.01-RC and 0.05-RC altered rectangular waves may have a positive peak voltage of 1.5 V and a negative peak voltage of −0.5 V. The 0.1-RC altered rectangular wave may have a lower negative peak voltage than the 0.05-RC altered rectangular wave, and the 0.5-RC altered rectangular wave may have a lower positive peak voltage than the 0.1-RC altered rectangular wave.

The positive and negative integral values of the 0.01-RC altered rectangular wave may be the same. Thus, in case that a threshold voltage Vth is lower than the input voltage Vin, the net DC voltage (VDC) of the 0.01-RC altered rectangular wave may be close to zero, and no ion mobility may occur ("Zero Ion Mobility"). In case that the threshold voltage Vth increases, the net DC voltage (VDC) of the 0.01-RC altered rectangular wave considerably increases so that the deflection rate of the 0.01-RC altered rectangular wave may be maximized ("Maximum Deflection Rate"). For example, in case that the ratio of the threshold voltage Vth to the input voltage Vin, i.e., Vth/Vin, is 0.6 or greater, the net DC voltage (VDC) of the 0.01-RC altered rectangular wave may reach its maximum.

The positive and negative integral values of the 0.05-RC altered rectangular wave may be the same. Thus, in case that a threshold voltage Vth is lower than the input voltage Vin, the net DC voltage (VDC) of the 0.05-RC altered rectangular wave may be close to zero, and no ion mobility may occur ("Zero Ion Mobility"). In case that the threshold voltage Vth increases, the net DC voltage (VDC) of the 0.05-RC altered rectangular wave considerably increases so that the deflection rate of the 0.05-RC altered rectangular wave may be maximized ("Maximum Deflection Rate"). For example, in case that the ratio of the threshold voltage Vth to the input voltage Vin, i.e., Vth/Vin, is 0.6, the net DC voltage (VDC) of the 0.05-RC altered rectangular wave may reach its maximum. The maximum net DC voltage of the 0.05-RC altered rectangular wave may be lower than the maximum net DC voltage of the 0.01-RC altered rectangular wave.

The positive and negative integral values of the 0.1-RC altered rectangular wave may be the same. Thus, in case that a threshold voltage Vth is lower than the input voltage Vin, the net DC voltage (VDC) of the 0.1-RC altered rectangular wave may be close to zero, and no ion mobility may occur ("Zero Ion Mobility"). In case that the threshold voltage Vth increases, the net DC voltage (VDC) of the 0.1-RC altered rectangular wave considerably increases so that the deflection rate of the 0.1-RC altered rectangular wave may be maximized ("Maximum Deflection Rate"). For example, in case that the ratio of the threshold voltage Vth to the input voltage Vin, i.e., Vth/Vin, is 0.6, the net DC voltage (VDC) of the 0.1-RC altered rectangular wave may reach its maximum. The maximum net DC voltage of the 0.1-RC altered rectangular wave may be lower than the maximum net DC voltage of the 0.05-RC altered rectangular wave. Accordingly, the greater the RC value of an altered rectangular wave, the less the maximum net DC voltage of the altered rectangular wave.

Figure 26:
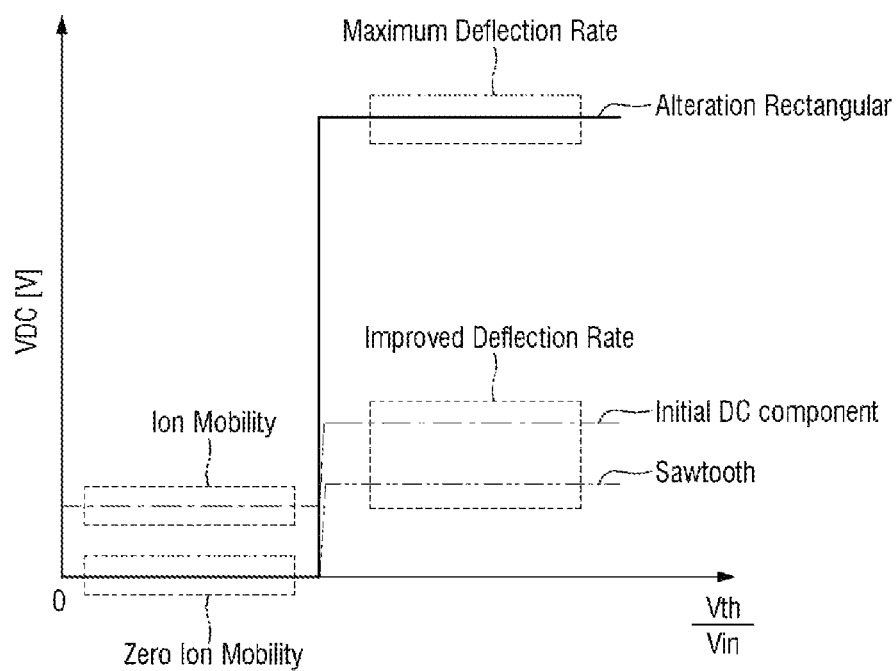
FIG. 26 is a schematic graph showing net DC voltages for different alignment signals according to an embodiment of the disclosure.

FIG. 26 is a schematic graph showing net DC voltages for different alignment signals according to an embodiment of the disclosure. FIG. 26 compares the net DC voltages of the sawtooth waves of FIG. 18, the alignment signals of FIGS. 21 and 22, and the altered rectangular waves of FIGS. 23 and 24.

Referring to FIG. 26, in case that a threshold voltage Vth is lower than an input voltage Vin, the net DC voltage (VDC) of the sawtooth waves of FIG. 18 may be close to zero, and no ion mobility may occur ("Zero Ion Mobility"). Thus, the sawtooth waves of FIG. 18 may improve the input efficiency of alignment signals. In case that the threshold voltage Vth increases, the net DC voltage (VDC) of the sawtooth waves of FIG. 18 may increase so that the deflection rate of the sawtooth waves of FIG. 18 may be improved ("Improved Deflection Rate").

In case that the threshold voltage Vth is lower than the input voltage Vin, the net DC voltage (VDC) of the alignment signals of FIGS. 21 and 22 may be greater than zero, and ion mobility may occur. Accordingly, the input efficiency of the alignment signals of FIGS. 21 and 22 may be lowered, and the consumption of power may increase.

In case that the threshold voltage Vth is lower than the input voltage Vin, the net DC voltage (VDC) of the altered rectangular waves of FIGS. 23 and 24 may be close to zero, and no ion mobility may occur ("Zero Ion Mobility"). Thus, the altered rectangular waves of FIGS. 23 and 24 may improve the input efficiency of alignment signals.

In case that the threshold voltage Vth increases, the net DC voltage (VDC) of the altered rectangular waves of FIGS. 23 and 24 may considerably increase so that the deflection rate of the altered rectangular waves of FIGS. 23 and 24 may be maximized ("Maximum Deflection Rate"). For example, in case that the threshold voltage Vth exceeds the negative peak voltage of the altered rectangular waves of FIGS. 23 and 24, the negative integral value of the altered rectangular waves of FIGS. 23 and 24 may converge to zero, and the positive integral value of the altered rectangular waves of FIGS. 23 and 24 may become considerably greater than the negative integral value of the altered rectangular waves of FIGS. 23 and 24. Thus, the apparatus 1000 can improve the emission efficiency of the display device 10 by improving the efficiencies of alignment and deflection of light-emitting elements ED.

FIG. 27 is a schematic flowchart illustrating a method of manufacturing a display device according to an embodiment of the disclosure.

Referring to FIG. 27, the apparatus 1000 may provide alignment signals to each of the panel cells CEL. The panel cells CEL, each including the first alignment lines AL1 and the second alignment lines AL2, may be prepared (S110)

The field application unit 1500 may provide the first and second alignment signals AS1 and AS2 having a predetermined or selectable difference in electric potential therebetween to the first alignment lines AL1 and the second alignment lines AL2 (S120). The first alignment lines AL1 may receive the first alignment signal AS1 through the first alignment pads AP1, and the second alignment lines AL2 may receive the second alignment signal AS2 through the second alignment pads AP2. The altered rectangular waves of FIGS. 23 and 24 may correspond to the difference in electric potential between the first and second alignment signals AS1 and AS2. The positive peal voltage of the altered rectangular waves of FIGS. 23 and 24 may differ from the negative peak voltage of the altered rectangular waves of FIGS. 23 and 24, and the positive pulse width of the altered rectangular waves of FIGS. 23 and 24 may differ from the negative pulse width of the altered rectangular waves of FIGS. 23 and 24. The positive integral value (i.e., A×B) of the altered rectangular waves of FIGS. 23 and 24 may be substantially the same as the negative integral value (i.e., A×B) of the altered rectangular waves of FIGS. 23 and 24.

The apparatus 1000 may align light-emitting elements ED in each of the first pixels SP1, the second pixels SP2, and the third pixels SP3, between the first alignment lines AL1 and the second alignment lines AL2, by providing alignment signals to the first and second panel cells CEL1 and CEL2 (S130).

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure.

What is claimed is:

1. An apparatus for manufacturing a display device, comprising:
a stage;
a panel cell disposed on the stage and including:
a first alignment line; and
a second alignment line extending parallel to the first alignment line;

a field application part providing an alignment signal to the first alignment line and the second alignment line of the panel cell; and light-emitting elements aligned between the first alignment line and the second alignment line, wherein the field application part provides an alignment signal to the first alignment line and the second alignment line, the alignment signal having the same positive integral value and negative integral value, having a different positive peak voltage from the alignment signal's negative peak voltage, and having a different positive pulse width from the alignment signal's negative pulse width.

2. The apparatus of claim 1, wherein the alignment signal corresponds to a difference in electric potential between first and second alignment signals, which are applied to the first alignment line and the second alignment line.

3. The apparatus of claim 1, wherein in case that the positive pulse width of the alignment signal is less than the negative pulse width of the alignment signal, the positive peak voltage of the alignment signal is higher than the negative peak voltage of the alignment signal.

4. The apparatus of claim 1, wherein in case that the alignment signal is a rectangular wave having a cycle of T, a positive pulse width of A, and a positive peak voltage of B (where T, A, B are positive real numbers), the negative pulse width of the alignment signal is T−A, and the negative peak voltage of the alignment signal is −(A×B)/(T−A).

5. The apparatus of claim 4, wherein in case that a threshold voltage of the alignment signal is zero, a net direct current (DC) voltage of the alignment signal is zero.

6. The apparatus of claim 4, wherein in case that an threshold voltage of the alignment signal exceeds the negative peak voltage of the alignment signal, a net DC voltage of the alignment signal is maximized.

7. The apparatus of claim 4, wherein as an RC value of the panel cell increases, a net DC voltage of the alignment signal decreases.

8. The apparatus of claim 1, further comprising:
a voltage output generating and outputting the alignment signal;
an amplifier amplifying the alignment signal and providing the amplified alignment signal to the field application part;
a controller providing a control signal, which determines a waveform of the alignment signal, to the voltage output;
an emission driver receiving an emission timing signal from the controller and outputting an emission driving signal; and
a light irradiation part receiving the emission driving signal from the emission driver and applying light to the panel cell.

9. The apparatus of claim 8, wherein the controller synchronizes the control signal and the emission timing signal such that the alignment signal and the emission timing signal have a same frequency.

10. An apparatus for manufacturing a display device, comprising:
a stage;
a panel cell disposed on the stage and including:
a first alignment line; and
a second alignment line extending parallel to the first alignment line;
a field application part providing an alignment signal to the first alignment line and the second alignment line of the panel cell; and
light-emitting elements aligned between the first alignment line and the second alignment line, wherein the field application part provides an alignment signal to the first alignment line and the second alignment line, the alignment signal having a different positive peak voltage from the alignment signal's negative peak voltage, having a different positive pulse width from the alignment signal's negative pulse width, and having an initial direct current (DC) component of 0.

11. The apparatus of claim 10, wherein in case that the positive pulse width of the alignment signal is less than the negative pulse width of the alignment signal, the positive peak voltage of the alignment signal is higher than the negative peak voltage of the alignment signal.

12. The apparatus of claim 10, wherein in case that the alignment signal is a rectangular wave having a cycle of T, a positive pulse width of A, and a positive peak voltage of B (where T, A, B are positive real numbers), the negative pulse width of the alignment signal is T−A, and the negative peak voltage of the alignment signal is −(A×B)/(T−A).

13. The apparatus of claim 12, wherein in case that a threshold voltage of the alignment signal is zero, a net DC voltage of the alignment signal is zero.

14. The apparatus of claim 12, wherein in case that a threshold voltage of the alignment signal exceeds the negative peak voltage of the alignment signal, a net DC voltage of the alignment signal is maximized.

15. The apparatus of claim 12, wherein as an RC value of the panel cell increases, a net DC voltage of the alignment signal decreases.

16. A method of manufacturing a display device, comprising:
preparing a panel cell including:
a first alignment line; and
a second alignment line extending parallel to the first alignment line;
providing an alignment signal to the first alignment line and the second alignment line, the alignment signal having a same positive integral value and negative integral value, having a different positive peak voltage from the alignment signal's negative peak voltage, and having a different positive pulse width from the alignment signal's negative pulse width; and
aligning light-emitting elements between the first alignment line and the second alignment line.

17. The method of claim 16, wherein in case that the positive pulse width of the alignment signal is less than the negative pulse width of the alignment signal, the positive peak voltage of the alignment signal is higher than the negative peak voltage of the alignment signal.

18. The method of claim 16, wherein in case that the alignment signal is a rectangular wave having a cycle of T, a positive pulse width of A, and a positive peak voltage of B (where T, A, B are positive real numbers), the negative pulse width of the alignment signal is T−A, and the negative peak voltage of the alignment signal is −(A×B)/(T−A).

19. The method of claim 18, wherein in case that a threshold voltage of the alignment signal is zero, a net direct current (DC) voltage of the alignment signal is zero.

20. The method of claim 18, wherein in case that a threshold voltage of the alignment signal exceeds the negative peak voltage of the alignment signal, a net DC voltage of the alignment signal is maximized.

* * * * *